(12) United States Patent
Sweeney et al.

(10) Patent No.: US 6,498,582 B1
(45) Date of Patent: Dec. 24, 2002

(54) RADIO FREQUENCY RECEIVING CIRCUIT HAVING A PASSIVE MONOPULSE COMPARATOR

(75) Inventors: Anthony Sweeney, Salem, NH (US); Mark A. Hebeisen, Tewksbury, MA (US); Andrew B. Forbes, Somerville, MA (US); Ray Gingras, Merrimac, MA (US); John Toth, Reading, MA (US); Michael J. Delcheccolo, Andover, MA (US); George La Fave, Tewksbury, MA (US); Joseph Licciardello, Lawrence, MA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/633,298

(22) Filed: Aug. 8, 2000

Related U.S. Application Data

(63) Continuation-in-part of application No. 09/100,689, filed on Jun. 19, 1998, now Pat. No. 6,100,841.

(51) Int. Cl.[7] .............................................. G01S 13/44
(52) U.S. Cl. ....................... 342/149; 342/153; 342/165; 342/173; 342/174
(58) Field of Search ................................ 342/149, 150, 342/151, 152, 153, 154, 175, 89, 165, 173, 174, 378–384; 326/99

(56) References Cited

U.S. PATENT DOCUMENTS

| | | | |
|---|---|---|---|
| 3,175,213 A | 3/1965 | Varela | |
| 3,710,280 A | 1/1973 | Buck | |
| 3,778,824 A | 12/1973 | Roger | |
| 3,906,495 A | 9/1975 | Roger | |
| 3,921,171 A | * 11/1975 | Strother, Jr. et al. | ........ 342/150 |
| 4,160,975 A | 7/1979 | Steudel | |
| 4,646,093 A | 2/1987 | Postema et al. | |
| 4,791,421 A | 12/1988 | Morse et al. | |
| 4,904,965 A | 2/1990 | Blight et al. | |
| 4,980,925 A | 12/1990 | Blustine et al. | |
| 5,051,752 A | 9/1991 | Woolley | |
| 5,091,730 A | 2/1992 | Cardiasmenos et al. | |
| 5,208,563 A | 5/1993 | Russell et al. | |
| 5,229,774 A | 7/1993 | Komatsu | |
| 5,315,304 A | 5/1994 | Ghaleb et al. | |
| 5,463,872 A | 11/1995 | Vader et al. | |
| 5,528,174 A | * 6/1996 | Sterzer | ......................... 326/99 |
| 5,528,175 A | * 6/1996 | Sterzer | ......................... 326/99 |
| 5,886,591 A | 3/1999 | Jean et al. | |

FOREIGN PATENT DOCUMENTS

| | | |
|---|---|---|
| EP | 0 371 494 A2 | 12/1988 |
| EP | 0 389 673 A2 | 3/1989 |
| GB | 2220813 A | 1/1990 |
| WO | WO 99/66596 A1 | 12/1999 |

OTHER PUBLICATIONS

Raman, Sanjay; "A W–Band Dielectric–Lens–Based Integrated Monopulse Radar Receiver", IEEE Transactions on Microwave Theory and Techniques, vol. 46, No. 12, Part 2, Dec. 1998, pp. 2308–2315.

(List continued on next page.)

Primary Examiner—Bernarr E. Gregory
(74) Attorney, Agent, or Firm—Daly, Crowley & Mofford, LLP

(57) ABSTRACT

A passive MMIC monopulse comparator includes a plurality of lumped element hybrids having pi and T filter structures. In one embodiment, a first hybrid receives first and second downcoverted signals and provides a first output signal to a third hybrid and second output signal to a fourth hybrid. A second hybrid receives third and fourth downconverted signals and provides respective third and fourth output signals to the third and fourth hybrids. The third hybrid provides sum and elevation channel signals and the fourth hybrid provides azimuth and G channel signals.

13 Claims, 13 Drawing Sheets

OTHER PUBLICATIONS

Parisi, Samuel J.; "180 Lumped Element Hybrid", International Microwave Symposium, Long Beach, Jun. 13–15, 1989, vol. 1–3, New York, IEEE, US, Jun. 13, 1989, pp. 1243–1246.

Barker, N. Scott et al., "An Octave Bandwidth Monopulse Processor", 1997 IEEE MIT–S International Microwave Symposium Digest, Denver, Jun. 8–13, 1997, IEEE MIT–S, New York, NY: IEEE, US, vol. 2, Jun. 8, 1997, pp. 405–407.

* cited by examiner

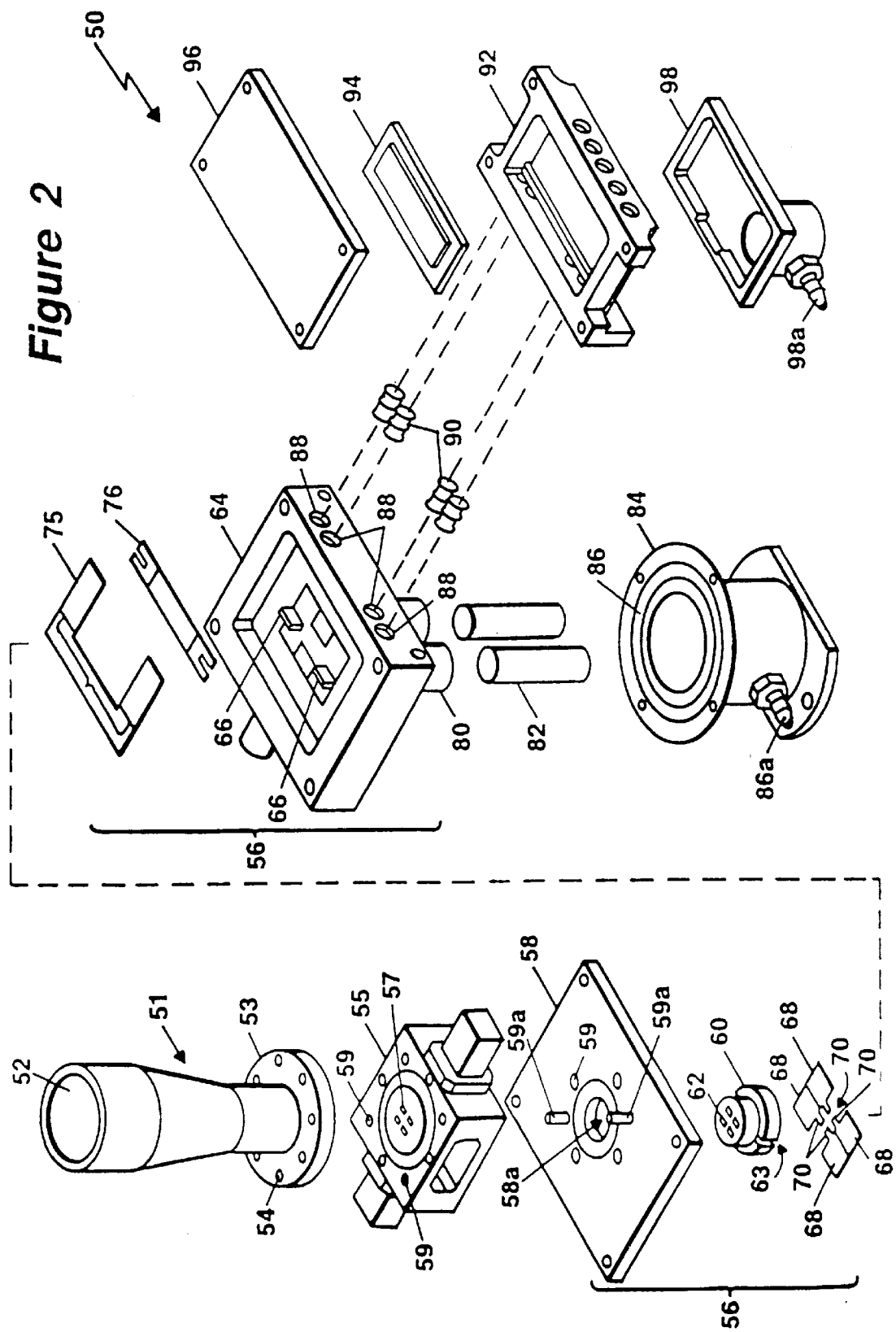

RADIO FREQUENCY RECEIVING CIRCUIT HAVING A PASSIVE MONOPULSE COMPARATOR

RELATED APPLICATIONS

This application is a continuation-in-part of U.S. patent application Ser. No. 09/100,689, filed on Jun. 19, 1998 now U.S. Pat. No. 6,100,841.

GOVERNMENT RIGHTS

Not applicable.

FIELD OF THE INVENTION

This invention relates generally to receiver circuits and more particularly to radio frequency (RF) receiver circuits.

BACKGROUND OF THE INVENTION

As is known in the art, a radar system generally includes an antenna, a transmitter and a receiver. In general overview, the transmitter generates an electromagnetic signal which is emitted or radiated through the antenna. The radiated electromagnetic signal propagates in a predetermined region of space and intercepts one or more objects in the path of the electromagnetic radiation. Portions of the electromagnetic radiation reflect off the objects and propagate back towards the radar system where the reflected signals are detected by the receiver. Such reflected signals are sometimes referred to as return or echo signals.

If the radar system employs a directive antenna, a relatively narrow beam of electromagnetic radiation is emitted and the direction from which the return signals propagate and hence the bearing of the object may be estimated. The distance or range to the reflecting object can be estimated by transmitting signal pulses and measuring the time period between the transmission of the transmitted pulse and reception of the return signal pulse.

One particular type of radar system is a monopulse radar system. A monopulse radar system refers to a radar system which obtains a complete measurement of an object's angular position by transmitting a single signal pulse and receiving the corresponding return or echo pulse. Together with a range measurement performed with the same pulse, the object position in three dimensions is determined completely. Typically, a series or train of echo pulses is employed to make a large number of repeated measurements and produce a refined estimate of the object's position.

A monopulse receiving system typically includes a monopulse circuit which receives signals from the antenna and forms sum and difference monopulse output signals. The sum and difference signals are formed by combining received antenna signals in a particular manner. The signals can be combined using circuits referred to as hybrid circuits. The hybrid circuits may be provided as so-called magic-T or rat race circuits which receive signals fed thereto and add and/or subtract the signals in a known manner. Such hybrid circuits can be fabricated using either printed circuit or waveguide transmission lines.

To determine the location of an object in a single angular coordinate (e.g. either azimuth or elevation), the monopulse circuit need only include a single hybrid circuit and thus the monopulse circuit is relatively compact. To determine the location of an object in two angular coordinates (e.g. both azimuth and elevation), the monopulse circuit requires multiple hybrid circuits. Thus, conventional monopulse circuits capable of determining the location of an object in two angular coordinates can become relatively large.

The monopulse sum and difference signals can be formed either at the transmitted signal frequency or, after down conversion of a return signal, at a lower frequency. The transmit signal frequency is typically in the microwave or millimeter wave frequency range. When the monopulse sum and difference signals are formed at the transmitted signal frequency, the monopulse is typically coupled directly to the antenna with relatively few, if any, circuits disposed between the antenna output ports and the monopulse input ports. The operations to generate monopulse sum and difference signals typically are performed at microwave or millimeter wave frequencies by the hybrid circuits which are typically fabricated using either printed circuit or waveguide transmission lines.

Obtaining the sum and difference signals at the transmitted signal frequency (i.e., before any down conversion) reduces the amount of additional errors which may be otherwise introduced into the signals used to form the monopulse signals by circuits (e.g. mixer circuits) coupled between the antenna output ports and the monopulse input ports. For example, to form the monopulse signals after down conversion of a return signal to a lower frequency it is necessary to couple a mixer or other frequency translation device between the antenna output ports and the monopulse input ports. Practical frequency translation devices (e.g. mixer circuits) introduce errors into the signals which are combined in the monopulse circuit to provide the monopulse output signals.

Typically, a single sum channel and a pair of difference channels are formed by the monopulse circuit to allow resolution of two angular coordinates. In systems which utilize a conventional waveguide multimode horn feed, a waveguide monopulse network can process a radar return signal to generate monopulse sum and difference signals which propagate in appropriate monopulse sum and difference channels. The radio frequency (RF) signals propagating through the monopulse channels are converted to intermediate frequency (IF) signals using waveguide mixers. The IF signals are fed to an IF receiver for additional processing.

One problem with this RF waveguide approach to implementing the monopulse network is that the monopulse circuit is relatively large and must be fabricated using relatively expensive and time consuming precision machining or electroforming techniques. This is particularly true in those system which operate in the millimeterwave frequency range. To overcome this drawback, systems operating at millimeter wavelength,frequencies can downconvert received signals to an intermediate frequency prior to monopulse processing. With this approach, monopulse processing may be performed at the intermediate frequency in lieu of monopulse processing performed at the higher fundamental or transmit frequency. While the circuit fabrication tolerances are generally less severe at lower frequencies, there is a concomitant increase in the size of waveguide circuit components. Thus, the use of waveguide transmission lines to process and convert the monopulse information (especially at millimeter wave frequencies) is not a practical low cost solution suitable for high volume production.

To further complicate matters, projectiles such as missiles and submunitions having a relatively small diameter require relatively high resolution monopulse receivers to enable accurate tracking of a target. Conventional monopulse receiving systems operating in the 1 gigahertz (GHz) to 20 GHz frequency range do not provide the angular resolution needed to accurately track targets. Furthermore, the size of RF circuit components which operate in the 1 GHz to 20 GHz range are physically too large and cumbersome to be packaged in many small projectiles. Therefore, operation at millimeter wave frequencies above 30 GHz is required.

Missile seeker systems having a relatively large diameter typically operate at microwave frequencies and form monopulse output receive signals with comparator networks provided from hybrid circuit components implemented using stripline, coaxial or waveguide transmission media. The monopulse output signals are typically fed to amplifiers having a relatively high gain and a relatively low noise figure. The amplified signals are subsequently downconverted to an appropriate intermediate frequency (IF) by a radio frequency (RF) microwave mixer module. For those applications in which the monopulse receiver must be disposed in a projectile having a relatively small diameter, however, the signal transmission losses and overall size of conventional receiver systems adversely impact seeker performance. Operation at higher frequencies such as millimeter wave (MMW) frequencies is a necessity to achieve the requisite resolution but there are limitations in the availability of receiver devices which operate at such frequency bands. For example, it is relatively difficult and expensive to provide RF devices having the performance characteristics (e.g., noise figure, power handling, power limiting, etc.) required for efficient active seeker operation in the MMW frequency range.

The complexity of radar systems operating in the millimeter wave frequency band will be appreciated when it is recognized that at an operating frequency of 94 GHz, for example, dimensions of a conventional rectangular waveguide are in the order of 0.050 to 0.100 inches, with tolerances of better than 0.001 inches required in many critical assemblies. Although it may be possible to fabricate such millimeter-wave waveguide structures at somewhat reduced cost using modem fabrication techniques, the expense associated with tuning and testing such critically toleranced hardware is often cost prohibitive.

Furthermore, the problems of packaging and tuning a millimeter-wave seeker in a conventional submunition will be appreciated when it is recognized that a monopulse seeker with a monopulse tracking capability utilizing waveguide components may well require in excess of twenty different waveguide components to control the routing and duplexing of the various signals coming from the transmitter and returning to the receivers. If a monopulse capability were required, then all of the foregoing waveguide components would be required to track from channel to channel in both amplitude and phase.

At an operating frequency of 94 GHz, each one thousandth of an inch in the length of a waveguide transmission line is equivalent to about 2° of phase. It should, therefore, be appreciated that it is relatively difficult to obtain inexpensively the requisite phase and amplitude tracking between various receiver channels.

Another problem inherent in millimeter-wave radar seekers utilizing waveguide devices is that of providing sufficient isolation between a transmitter and receiver. This problem is exacerbated by the fact that waveguide switches and circulators which can withstand relatively high power transmit signals and provide a high degree of isolation are not generally available in a compatible size at relatively high operating frequencies.

It would, therefore, be desirable to provide a relatively compact monopulse receiver having a relatively low noise figure which operates in the millimeter wave frequency range and which can operate in a system which includes a transmitter which transmits signals having relatively high power levels.

SUMMARY OF THE INVENTION

In accordance with the present invention, a radio frequency (RF) system includes an antenna having a plurality of antenna ports and a plurality of protection circuits each of the protection circuits having a first port coupled directly to a respective one of the plurality of antenna ports and a second port. In response to a first control signal, each protection circuit allows signals to propagate from a respective one of the antenna ports to the second port of the respective protection circuit along a signal path having a relatively low insertion loss characteristic. Each protection circuit is also responsive to a second control signal in a first direction between the first protection circuit port and the second protection circuit port and responsive to a second control signal which isolates the first protection circuit port from the second protection circuit port. With this particular arrangement, a compact RF system is provided. By coupling the antenna ports directly to the ports of the protection circuit, the RF system can operate in a receive mode and be protected from transmit signal having high signal levels generated by a transmitter circuit during a transmit operating mode. To operate in a receive mode, the protection circuit is biased to provide a signal path having a relatively low insertion loss characteristic to signals propagating from the antenna ports through the protection circuit ports. During the transmit mode, the protection circuit is biased to provide a signal path having high insertion loss characteristic from signals propagating from the antenna ports. In one particular embodiment, the RF system further includes a plurality of mixers, each having a first port coupled to a respective one of the plurality of protection circuit ports and a second port for receiving a mixer bias signal and a third port for providing a frequency shifted signal. By coupling the mixers to the protection circuit ports, a compact receiver assembly is provided. An amplifier can be coupled to the third port of each mixer to thus provide a system having a relatively high gain characteristic while also providing a system which provides a relatively low noise figure. Also a monopulse can be coupled to the output ports of the amplifiers to provide an RF monopulse receiving system. In a preferred embodiment, the mixers, amplifiers and monopulse circuit are provided as monolithic microwave integrated circuits (MMICs) and thus the RF system utilizes a relatively small physical area. Furthermore the antenna can be provided as a corrugated horn having a moding structure disposed in a base portion thereof to couple signals between the antenna input and the antenna ports in the base structure of the corrugated horn which are coupled to the first port of each of the protection circuits. The receiving system may also include a calibration signal injection circuit coupled to the protection circuit to inject a calibration signal into the receiving system. In one particular embodiment, the protection circuit is a latching ferrite isolator matrix which includes a plurality of isolators each having first, second and third ports with the calibration signal injection circuit coupled to the third port of each of the plurality of isolators.

In accordance with a further aspect of the present invention, a radio frequency (RF) monopulse receiver includes a plurality of mixers, each having an RF signal port, a local oscillator (LO) signal port and an intermediate frequency (IF) signal port and each of the mixers comprising one or more mixer diode anti-parallel pairs and means for coupling RF energy to the RF signal port of each of the plurality of mixers. The RF monopulse receiver further includes a plurality of IF amplifiers, each of the IF amplifiers having an amplifier input port coupled to the IF signal port of a respective one of the plurality of mixers and an amplifier output port coupled to a respective one of a plurality of input ports of a monopulse comparator network. In response to appropriate input signals fed thereto, the monopulse comparator network provides monopulse output signals at output ports thereof. With this particular technique, a compact millimeter wave monopulse receiver having a relatively low noise figure is provided. By arranging a latching ferrite isolator matrix protection circuit between an antenna and the mixer ports, the RF monopulse receiver is protected from high power transmit signals. Furthermore the latching ferrite isolator matrix allows use of a receiver circuit architecture which allows the compact millimeter wave monopulse receiver circuit to operate in an RF radar system having a relatively high transmit power. In one embodiment, the RF monopulse receiver is suitable for use in an active missile seeker system for example. The RF receiver can be used directly in a small submunition or alternatively, can function as the monopulse receiver for a higher resolution quasi-optically fed, antenna having an aperture much larger than the diameter of the horn antenna. In one embodiment, a cryogenic cooling system is coupled to the receiver to provide a receiver noise figure which is lower than the noise figure achieved when the receiver operates at ambient temperatures.

In accordance with a still further aspect of the present invention, an RF monopulse receiver includes a circuit assembly having a plurality of RF input ports and a plurality of IF output ports. The circuit assembly includes (a) a housing, (b) a plurality of subharmonically pumped mixer circuits disposed in the housing, each of the mixer circuits having an RF signal port, an LO signal port and an IF signal port and each of the mixer circuits including: (1) a plurality of mixer diode substrates disposed in the housing, each of the mixer diode substrates having a diode mounting region and a transmission coupling region which projects into an RF feed region which is formed by providing an opening in a housing cover disposed over the diode mounting region of the plurality of substrates; (2) an antiparallel diode pair disposed on the diode mounting region of each of the plurality of mixer diode substrates; (3) an LO distribution circuit coupled between the LO signal port of each subharmonically pumped mixer circuit and an LO signal source; (4) an IF distribution circuit coupled between the IF signal port of each subharmonically pumped mixer circuit and an IF output port of the RF monopulse receiver; (c) an RF feed circuit, coupled to the housing, (d) means for coupling RF energy to the RF signal port of each of the plurality of subharmonically pumped mixer circuits; (e) a monopulse substrate; and (f) a monolithic microwave integrated circuit (MMIC) monopulse comparator network disposed on the monopulse substrate, the MMIC monopulse comparator network having a plurality of monopulse circuit input ports, each of the plurality of monopulse circuit input ports coupled to a respective one of the IF ports of the plurality of subharmonically pumped mixer circuits and having a plurality of monopulse circuit output ports coupled to the IF output ports of the monopulse substrate. With this particular arrangement, an RF monopulse receiver suitable for use in the W-band frequency range is provided. The system can further include a corrugated horn antenna having a moding structure in a base portion thereof to provide four separate antenna ports. The antenna base ports are coupled to the RF ports of the mixer circuits providing signals between the antenna ports in the base structure of the corrugated horn and the RF port of the mixer circuits. A protection circuit can be included in a waveguide signal path disposed between the antenna ports and the RF input port of the mixer circuits. In one particular embodiment, the protection circuit is provided as a latching ferrite isolator matrix which includes a plurality of isolators each having first, second and third ports. The RF monopulse receiver can also include a calibration signal injection circuit coupled to the protection circuit to inject a calibration signal into the receiver. When the protection circuit is provided as the latching ferrite isolator matrix, a calibration signal injection circuit can be coupled to the third port of each of the plurality of isolators. In response to a first control signal, the latching ferrite isolators allow signals to propagate in a first direction between a first pair of isolator ports and in response to a second control signal, the latching ferrite isolators allow signals to propagate in a second direction between a second pair of isolator ports. With such an arrangement, the RF monopulse receiver can operate without being damaged in those RF systems which include a transmitter. Furthermore, the housing may be provided as a single housing having both RF and IF circuit components disposed therein including the MMIC monopulse comparator network. Alternatively, the housing can be provided from an RF housing and an IF housing which are physically and electrically coupled together. The RF signal components including the RF mixer and an amplifier are disposed in the RF housing and the MMIC monopulse comparator network and an amplitude adjustment circuit and phase shifter are disposed in the IF housing with a plurality of RF interconnect signal paths providing RF signal paths between the RF housing and the IF housing. The use of MMIC LNA's and a novel MMIC monopulse along with the development of a low conversion loss, low noise figure, W-Band mixer leads to a relatively small and efficient W-Band monopulse receiver which is compatible with small diameter missiles and submunitions and provides enhanced sensitivity to thus allow the seeker to accurately track targets. This enhanced sensitivity is achieved with the inclusion of cooling hardware which is used to locally cool the mixer diodes.

BRIEF DESCRIPTION OF THE DRAWINGS

The foregoing features of the invention, as well as the invention itself may be more fully understood from the following detailed description of the drawings, in which:

FIG. 2 is an exploded isometric view of a receiving system;

DESCRIPTION OF THE PREFERRED EMBODIMENTS

Figure 1:
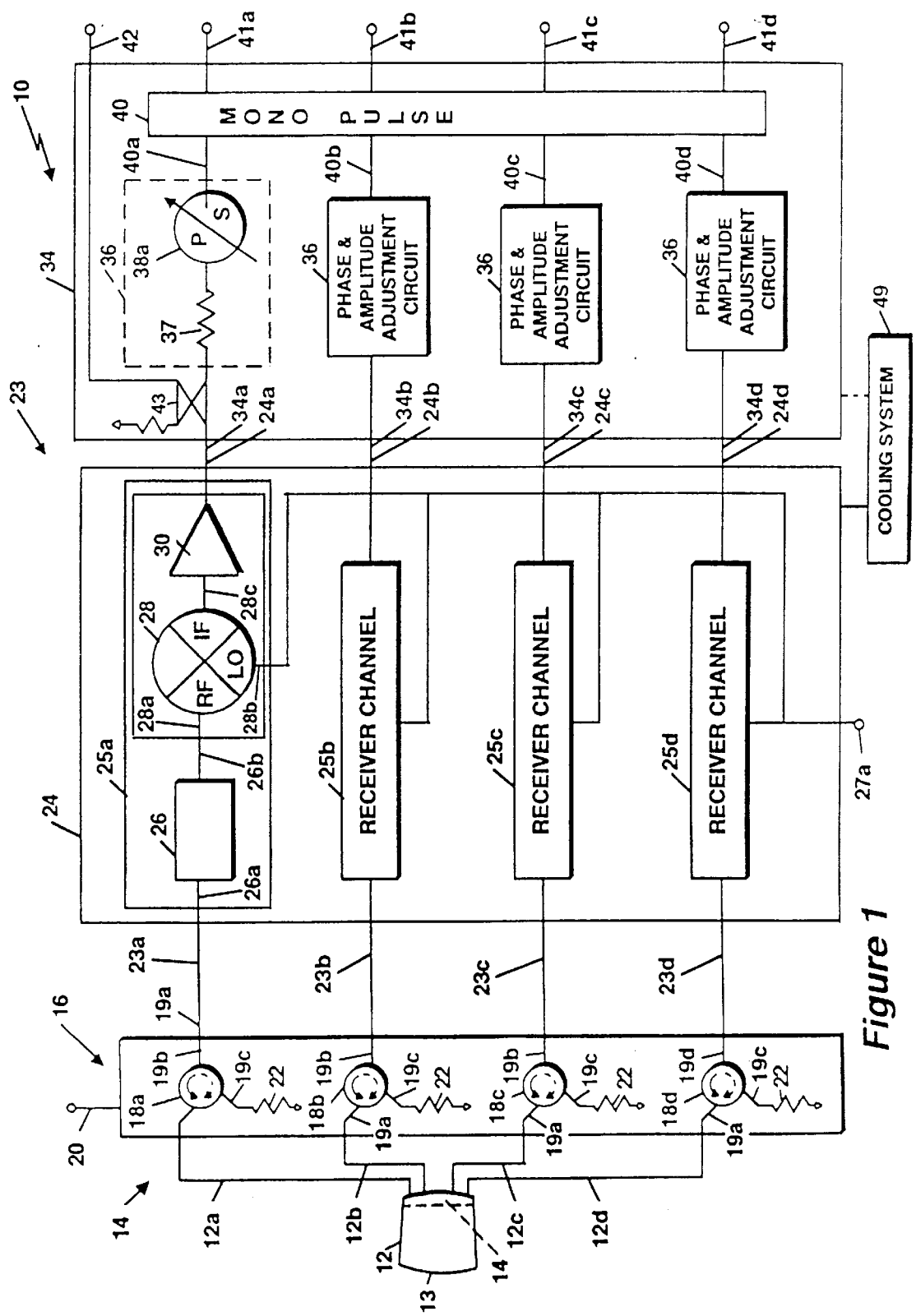
FIG. 1 is a schematic diagram of a receiving system.

Referring now to FIG. 1, a radio frequency (RF) receiving system 10 includes an antenna 12 having a plurality of antenna output ports 12a–12d. The antenna 12 may be provided as any type of antenna capable of receiving signals in a desired frequency range. The antenna 12 may be provided, for example, as a horn antenna, an array antenna or any other type of antenna capable of receiving RF signals at a first end 13 and providing output signals at the antenna ports 12a–12d.

The antenna ports 12a–12d are coupled to respective input ports of a protection circuit 16. In one particular embodiment, the antenna 12 is provided as a corrugated waveguide horn responsive to signals in the W-band frequency range and having a moding structure 14 provided in a base portion thereof to provide separate antenna ports. The antenna 12 receives RF energy at the first end 13 and the moding structure 14 separates RF energy propagating in the horn 12 for transmission along four separate transmission line signal paths. In one embodiment, the transmission lines are provided as waveguide transmission lines having a size and shape selected to facilitate efficient propagation of RF signals in the frequency range of interest.

Protection circuit 16 can prevent signals having relatively high amplitude levels from propagating to the remaining circuit components of system 10 thereby reducing the possibility of such components being damaged by signals having excessive signal amplitudes.

Protection circuit 16 is provided, in one embodiment, as a latching ferrite isolator matrix, which includes a plurality of latching ferrite isolators 18a–18d generally denoted 18. Each of the isolators 18 has first, second and third ports 19a–19c with a termination 22 coupled to ports 19c. In response to a first control signal provided to isolators 18a–18d through a bias line 20, the isolators 18 are polarized or biased such that signals propagate through isolators 18 in a first direction. For example, in response to a first control signal provided to isolators 18, RF signals provided to port 19a are coupled in a clockwise direction to port 19b and are isolated from port 19c.

In response to a second control signal provided to isolators 18, the isolators 18 are biased such that signals propagate through isolators 18 in a second different direction. For example, signals provided to port 19c are coupled in a counterclockwise direction through the isolator 18 to port 19b and are isolated from port 19a. The first and second control signals may be provided, for example, as current signals having a relatively high amplitude over a relatively short duration of time (i.e. "current spikes") which bias the isolators 18 in first and second opposite directions.

With the protection circuit 16 biased to allow signals to propagate from respective ones of the antenna ports 12a–12d through port 19a to port 19b of the respective isolators 18a–18d, the signals propagate from the antenna 12 through the protection circuit 16 to a receiver 23 at input ports 23a–23d. In this particular embodiment, receiver 23 is here shown as a monopulse receiver.

The receiver 23 includes an RF circuit module 24 having four like receiver channels 25a–25d. Taking receiver channel 25a as representative of the receiver channels 25b–25d, receiver channel 25a includes a transition circuit 26 having an input port 26a coupled to receiver input port 23a and an output port 26b coupled to an RF port 28a of an RF mixer 28. A mixer bias signal is fed through an RF circuit module port 27a to a mixer bias port 28b. In this particular embodiment, the mixer bias signal is provided as a local oscillator (LO) bias signal. In an alternate embodiment, however, the mixer can be biased with a DC bias signal which can be fed to mixer separately from the LO signal. The LO signal and RF signals fed to ports 28a, 28b respectively, are combined as is known to provide an intermediate frequency (IF) signal at a third mixer port 28c.

The mixer IF port 28c is coupled to an input port of an IF amplifier 30 which receives the IF signal fed thereto and provides an amplified output signal at an output port thereof. Thus each of the receiver channels 25a–25d provide IF output signals at output ports thereof.

The IF output signals are coupled to respective ones of input ports 34a–34d of an IF module 34. The IF module 34 receives the IF signals fed thereto and provides each of the IF signals to respective amplitude and phase adjustment circuits 36. In one particular embodiment, the phase and amplitude adjustment circuit includes a variable attenuator 37 and a six-bit phase shifter 38 with which the amplitude and phase adjustment, respectively, are accomplished. Those of ordinary skill in the art will appreciate that the phase shifter 38 may be provided having fewer or greater than six bits. The number of bits included in the phase shifter 38 is selected in accordance with a variety of factors including but not limited to the desired accuracy of the corrected signal, the number of control lines required to operate the phase shifter, the package size and weight, etc. With a six-bit phase shifter the least significant bit has a value of 5 degrees.

The appropriately amplitude and phase adjusted signals are coupled from each of the phase and amplitude adjustment circuits 36 to a monopulse circuit 40 at input ports 40a–40d. The monopulse circuit 40 combines signals fed to the input ports 40a–40d thereof and provides monopulse output signals ($\Sigma$, $\Delta$EL, $\Delta$AZ, Q) at ports 41a–41d.

It should be noted that in a preferred embodiment, monopulse 40 may be provided as a passive monolithic microwave integrated circuit (MMIC) monopulse circuit. In alternate embodiments, however, it may be desirable to provide the monopulse circuit 40 as an active MMIC circuit. Alternatively still, the monopulse circuit may be constructed from a transmission media other than a media which is suitable for fabrication of a MMIC circuit.

Figure 1A:
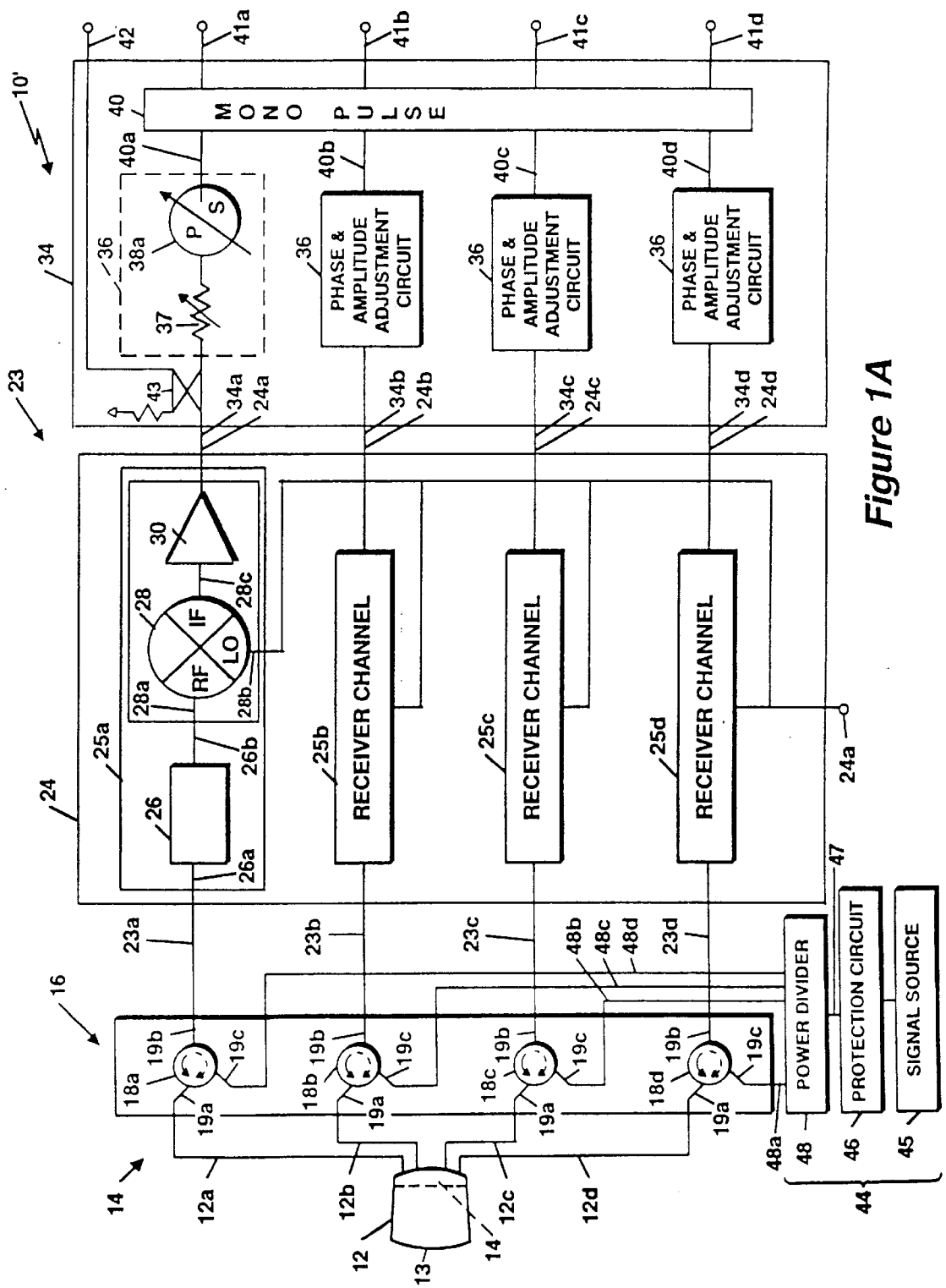
FIG. 1A is a schematic diagram of a receiving system having a calibration system coupled thereto.

Referring briefly to FIG. 1A, in an alternate embodiment, the system 10' includes a calibration circuit 44 which includes a calibration signal source 45 which provides a calibration signal through a protection circuit 46 which may be provided as an isolator or switch, for example. In a preferred embodiment, the calibration signal provided by the calibration signal source 45 corresponds to a substantially pure sinusoidal signal having a predetermined signal amplitude.

The calibration signal is coupled through protection circuit 46 to an input port 47 of a power divider 48. In this particular embodiment, power divider 48 includes output ports 48a through 48d each of which are coupled to a respective one of the isolators 18a–18d at isolator ports 19c.

The power divider 48 is here provided having a number of output ports corresponding to the number of receiver channels. However, in some applications, it may not be necessary to provide a calibration signal to each of the receiver channels. Thus, generally, the power divider 48 provides a calibration signal for each receiver channel 25 to be calibrated.

In some applications, it may be desirable to remove the terminations 22 (FIG. 1) coupled to the ports 19c of the isolators 18 to allow a calibration signal to be fed thereto while in other applications it may be desirable to couple the calibration signals to the isolator ports 19c through a switch (not shown). In this approach the common port of the switch would be coupled to isolator port 19c, a first switch arm would be coupled to a termination and a second switch arm would be coupled to receive a calibration signal from the calibration circuit 44. In still other applications it may be desirable to couple the calibration signal to a portion of the receiver channels.

The receiving system 10 operates in either a calibration mode or a receiving mode. To place the receiving system in the calibration mode, the isolators 18 are biased such that signals propagate in a counterclockwise direction therethrough such that signals propagate from port 19c to port 19b. The protection circuit 46 provides a relatively low insertion loss signal path between the signal source 45 and the power divider circuit 48.

In the calibration mode, the calibration signal source 45 provides calibration signals to port 19c of each isolator 18. The calibration signals are coupled from isolator ports 19c to ports 19b and provided as input signals to the RF circuit module 24 at ports 23a–23d. The RF circuit module 24 provides in response to the calibration signal frequency translated (i.e. a downconverted) calibration signals at the output ports 24a–24d.

The IF module 34 receives the downconverted calibration signals from RF modules ports 24a–24d and provides calibration monopulse output signals at ports 41a–41d. The amplitude and phase of the calibration output signals outputs 41a–41d can be monitored and correlated with expected channel-to-channel signal characteristics to provide error correction for the measured output signals. The expected channel-to-channel signal characteristics are defined during initial receiver integration and alignment based on known operating conditions which yield acceptable monopulse performance. Thus, the calibration mode allows correction of channel-to-channel errors resulting from the operational environments which cannot be predicted in advance such as (non-uniform module heating).

A second calibration circuit for introducing a calibration signal to IF module 34 includes an IF calibration signal port 42 through which a calibration signal is fed to a coupler circuit 43. The coupler circuit 43 couples a predetermined portion of the calibration signal to the input of the amplitude and phase adjustment circuit 36. The calibration signal propagates through circuit 36 to the monopulse 40 and calibration output signals are provided at ports 41a–41d. Here, the IF calibration signal is shown as being fed to only one channel of IF module 34. It should be appreciated, however, that the IF calibration signal could be fed to any single channel of IF module 34 or alternatively each channel of IF module could include a coupler 43 and the IF calibration signal could be fed (simultaneously or not) to all channels of IF module 34.

Referring again to FIG. 1, it should also be noted, that in some applications, it may be desirable to utilize the receiving system 10 as a feed circuit for a reflector antenna. This is accomplished by aligning the multimode feed horn 12 and the focal plane of a reflector. In other applications, however, the multimode feed horn 12 may be used directly as a monopulse antenna.

A optional cooling system 49 may be coupled to active circuit components such as mixers 28 and amplifiers 30 in each receiver channel 25 to cool active devices such as the mixer diodes in the components 28, and field effect transistors (FETs) in the amplifiers 30 to thus lower the noise figure of the receiver 23. The cooling system 49 may be used to cool either or both of mixers 28 and amplifiers 30 respectively.

To provide the system 10 having a compact size, the amplifiers 30, amplitude and phase adjustment circuits 36, phase shifters 38 and monopulse circuit 40, can all be provided as monolithic microwave integrated circuits (MMICs). Such an assembly results in a receiver 23 having a relatively low noise figure at room temperatures and having a size which allows use of the receiving system 10 in missiles, munitions and other projectiles having relatively small diameters.

Referring now to FIG. 2, a millimeter wave monopulse receiver 50 includes a corrugated horn assembly 51 having a first aperture with a pressure window 52 disposed therein. The pressure window 52 provides a sealing mechanism for the receiver 50 for reasons which will be explained more fully hereinbelow. A second end of the corrugated horn 51 includes a base plate 53 having a plurality of mounting holes 54 provided therein.

Corrugated horn 51 and pressure window 52 provide a relatively low insertion loss characteristic to signals having frequencies within a predetermined frequency band while still providing a sealed aperture via pressure window 52. In one particular embodiment, the corrugated horn 51 is suitable for coupling efficiently to a W-Band Quasi-optical Guassian Beam input signal.

Figure 2A:
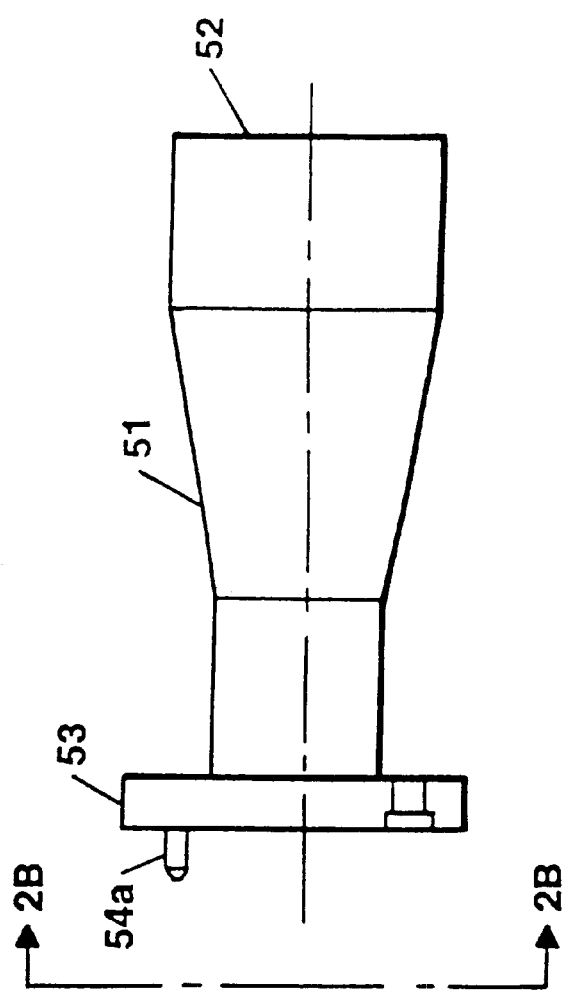
FIG. 2A is a side view of a multimode corrugated feed horn.
Figure 2B:
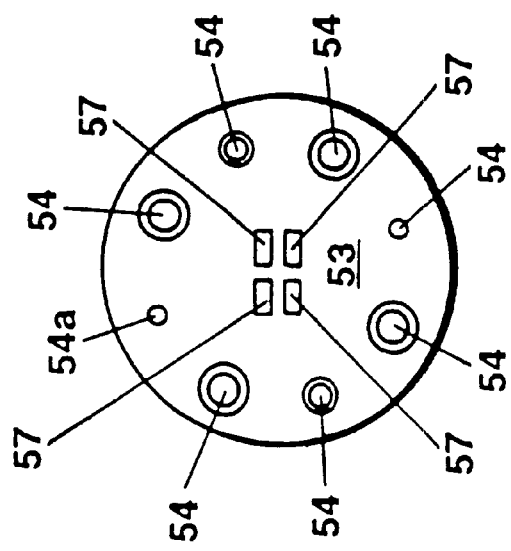
FIG. 2B is an end view of the multimode feed horn.

As may be more clearly seen in FIGS. 2A, 2B, also formed in the transition region between the horn flare and the baseplate is a moding structure which separates the captured energy into four identical waveguide transmission lines 57. Referring briefly to FIG. 2B waveguides 57 formed in the flange 53 can be clearly seen. Projecting from a surface of flange 53 are optional alignment pins 54a which engages a corresponding hole in the surface of a switch assembly 55 (FIG. 2) to thus align waveguide apertures 57 in the flange 53 with like-shaped apertures 57 in the switch assembly 55.

Referring again to FIG. 2, the waveguide energy passes through the latching ferrite isolator (switch) matrix 55 which is primarily used for protection purposes. The switch matrix 55 also allows for the injection of a W-Band calibration tone by feeding a calibration signal having a frequency in the W-band frequency range through one or more signal port(s) of the isolator(s) corresponding to isolator port 19c of FIG. 1.

In a receive mode of operation, the horn 51 receives RF signals and couples the received RF energy via a moding structure into the four rectangular shaped waveguide transmission lines 57 disposed in the flange 53 at the second or base end of the corrugated horn 51. Flange 53 is disposed over a first surface of the switch assembly 55 such that alignment holes and pin 54, 54a align with corresponding holes 59 in the switch assembly 55.

The switch assembly 55 may be a Latching Ferrite Isolator Matrix of the type provided by Electromagnetic Systems (EMS) Corporation and identified as model no. 449D-68. When receiver 50 is disposed in a missile or other projectile which includes a transmitter, the switch assembly 55 prevents transmitter leakage signals impinging on the horn 51 from propagating to a receiver circuit 56 since a relatively high power leakage signal could damage circuit components of the receiver circuit 56.

Since the time during which an RF transmit signal pulse could leak into the antenna 51 is known, the switch assembly 55 can be actively switched between transmit and receive states at appropriate points in time. When the switch assembly 55 is provided as a latching ferrite circulator, an insulated wire routed through a ferrite core carries a control signal provided as a DC current fed through the wire and establishes magnetic fields in the latching ferrite isolator 55 thereby biasing the ferrite and determining which of the circulator signal paths are provided having a relatively low insertion loss characteristic and which circulator signal paths are provided having a relatively high insertion loss characteristic (isolation). In this manner, predetermined ports of the latching ferrite isolator are said to be through ports (i.e. signals propagating in a particular direction from one port to the other experience a relatively small amount of signal attenuation) and predetermined ports of the latching ferrite isolator are said to be isolated ports (i.e. signals propagating in a particular direction from one port to the other experience a relatively large amount of signal attenuation).

Once the magnetic fields are established in the switch assembly 55, they are self-sustaining (i.e. latching) and the DC current can be removed. When it is desired to change the insertion loss characteristics between the ports of the switch assembly 55, a DC current having a minimum predetermined current level is applied to offset the bias field established via the previously applied signal and to reestablish the magnetic fields in the ferrite core and thereby change levels of insertion loss between the various ports in a second predetermined manner.

Thus, in this particular application, the circulator 55 is used to select a signal path having a relatively low insertion loss characteristic between the antenna 51 and one of the receiver channels or a high power RF termination (such as termination 22 in FIG. 1) during the receive and transmit functions, respectively. In a preferred embodiment, the switch assembly 55 provides either an isolation signal path having an isolation characteristic of 20 decibel (dB) or more or a relatively low loss signal path having an insertion loss characteristic of about 0.5 dB.

The switch assembly 55 also provides a convenient location for injection of a pre-monopulse RF calibration signal. Specifically, the switch port having the termination coupled thereto (e.g. port 19c in FIG. 1) can be used as a calibration signal input port as described above in conjunction with FIG. 1A.

If high power protection is not required for a particular application, switch assembly 55 may be omitted from the receiver 50 thereby reducing the size of the receiver 50. Also, since the switch 55 introduces an additional insertion loss to signals propagating from the antenna 51 to the receiver circuit 56, removal or omission of the switch assembly 55 also improves the noise figure of the overall system 50.

The switch assembly 55 is disposed over an RF module cover 58. Module cover 58 has an aperture 58a and a plurality of mounting holes 59 provided therein which mate with mounting holes 59 provided in the switch assembly 55. RF module cover 58 also includes one or more alignment pins 59a which project into alignment holes of the switch assembly 55 to thus align the RF module cover 58 to the switch assembly 55.

Disposed in the RF module cover aperture 58a is an RF insulation cover 60. The RF insulation cover 60 includes a plurality of waveguide signal paths 62 which align with the waveguide signal paths 57 provided in both the base portion 53 of the corrugated horn 51 and the switch assembly 55. The RF insulation cover 60 also includes one or more slots 63 which are used in a manner to be described below to insure proper alignment between the waveguides 57 of the horn 51, the switch assembly 55 and waveguides 62 in the insulation cover 60.

The receiver 50 further includes an RF housing 64 having a pair of alignment bosses 66 projecting from an internal bottom surface thereof. Alignment bosses 66 engage corresponding slots 63 in the RF insulation cover 60 thereby assuring proper orientation and positioning of the RF insulation cover 60 with respect to the waveguide 57 in the corrugated horn 51 and the switch 55. The alignment bosses 66 also ensure correct orientation and positioning of the waveguide signal paths 62 with respect to mixer circuits formed on substrates 68 when the substrates are disposed in RF housing 64 and aid in the isolation between adjacent receiver channels.

Figure 2C:
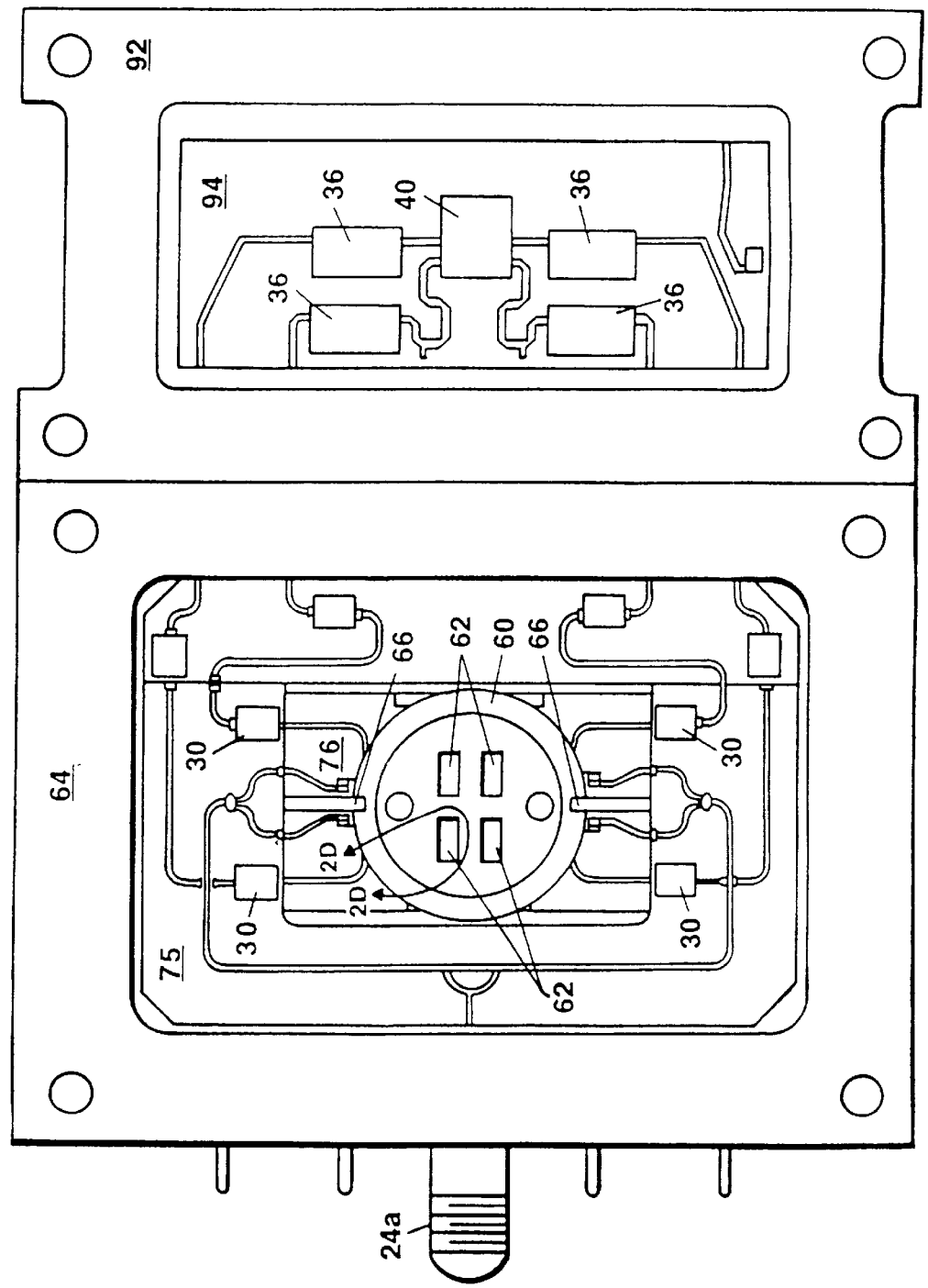
FIG. 2C is a plan view of a receiver.
Figure 2D:
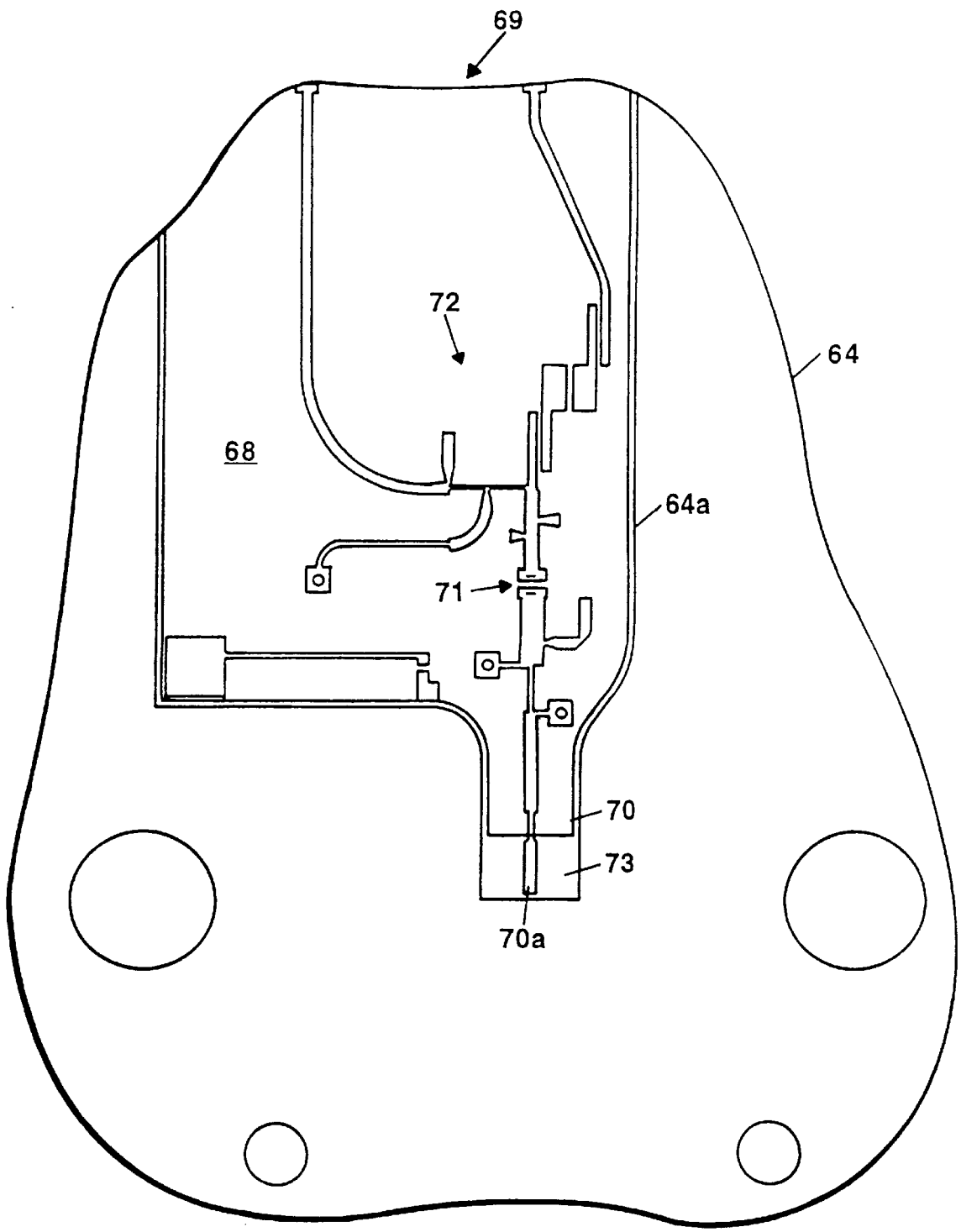
FIG. 2D is a plan view of an RF mixer circuit taken along lines 2D—2D of FIG. 2C.

Referring briefly to FIGS. 2C, 2D, prior to disposing the RF module cover 58 over the RF housing 64, a plurality of mixer substrates 68 are disposed in appropriately shaped recessed portions 64a (FIG. 2D) provided in an internal base portion of the RF housing 64 only a portion of which is shown in FIG. 2D. Disposed on the substrate 68 is a mixer circuit 69 (FIG. 2D). Each of the mixer substrates 68 includes a projecting portion 70 (FIG. 2D) which form so-called E-plane probes which couple electric field energy propagating substantially in the waveguide 62 in the TE10 waveguide mode into a microstrip mode to thus efficiently transition the W-band waveguide signals in the RF insulation cover 60 to subharmonic mixers 69 (FIG. 2D) in each receiver channel. Thus, the projecting portions 70 of the mixer substrates and the associated transmission line disposed thereon form waveguide-to-microstrip transition circuits.

Mixer diodes 71 and transmission lines 72 are disposed on the mixer substrate 68 to thus form the mixer circuit 69. The performance of the waveguide-to-microstrip transition circuit can be optimized via a waveguide backshort assembly 73 formed by spacing a bottom surface of the recess region 64a in the area of projecting region 70 a predetermined distance from the E-plane probe 70a disposed on projecting region 70. Portions of the substrate 70 have here been removed to expose the back short 73. The electric field configuration established by backshort 73 can be adjusted via the use of shims or other appropriate mechanism to allow the electric field signal to be efficiently coupled to the E-plane probe 70a. Ideally, such a backshort assembly establishes a short circuit impedance at particular physical location in the waveguide. In a preferred embodiment, the backshort assembly is disposed at a distance corresponding to an odd multiple of a quarter wave length (in the waveguide medium) from the protruding probe 70a.

Referring again to FIGS. 2 and 2C, also disposed in the RF housing 64 are LO and IF distribution circuit substrate 75 and an IF phasing substrate 76. The LO and IF distribution substrate 75 includes LO and IF distribution circuits to distribute the local oscillator and intermediate frequency signals to appropriate ports in the RF housing 64. The IF phasing substrate 76 is used to provide coarse phase compensation to phase match each of the receiver channels and provides additional IF signal amplification.

Once the mixer substrates 68, LO and IF distribution substrate 75, and IF phasing substrate 76 are disposed in housing 64, the RF insulation cover 60 is disposed thereover. The RF module cover 58, switch 55 and horn 51 can then be coupled to the RF module housing 64.

The RF housing 64 also has provided therein a plurality of openings 88 through which corresponding ones of IF interface connectors 90 are disposed to form an RF connection between the RF housing 64 and an IF housing 92. The IF housing 92 has an IF substrate 94 disposed therein. Disposed on IF substrate 94 is a monolithic microwave integrated circuit (MMIC) monopulse comparator network. Suffice it here to say that the MMIC monopulse comparator network receives signals fed thereto and forms monopulse output signals at output ports 92a–92d of the IF housing 92. An IF module cover 96 is disposed over the open surface of IF housing 92 and an IF evacuation housing 98 is disposed over a second opposite surface of the IF housing 92. The IF assembly is evacuated via an evacuation port 98a provided in the IF evacuation housing 98. The IF module can also include amplitude and phase adjustment circuits similar to amplitude and phase adjustment circuits 36 described above in conjunction with FIGS. 1 and 1A.

The mixer circuits 69 feed IF signals to corresponding ones of LNAs 30 (FIG. 2C) which in turn provide amplified IF signals via feedthrough circuits 90 to amplitude and phase adjustment circuits 36 (FIG. 2C) and monopulse circuit 40 (FIG. 2C).

As can be seen in FIG. 2, the RF housing 64 has projecting from a bottom surface thereof a pair of cryostat tube housings 80. The cryostat tube housings 80 accept cryostat assemblies 82 used to cool the mixer diodes and the low noise amplifiers thereby reducing the noise figure of the receiver assembly 56. An RF evacuation housing 84 is disposed over the cryostat tube housings and cryostat assemblies 82 and coupled to the bottom surface of the RF housing 64 via an air tight seal formed by a gasket 86. The RF assembly is evacuated via an evacuation port 86a provided in the RF evacuation housing 84.

In one embodiment, the cryogenic cooling hardware is fabricated from stainless steel. Two cryostats deliver Argon gas to the back surface of the RF housing 64, beneath the mixer diodes 71 (FIG. 2D). The two cryostats are disposed inside a dewar assembly which also functions as the evacuation chamber. A partial vacuum is pulled throughout the dewar/receiver assembly all the way to the sealed horn assembly. Vacuum seals are maintained at all mechanical interfaces between the horn and dewar assembly with greased O-rings.

Typical operating characteristics of a fully integrated W-Band receiver 50 including horn and switch assemblies are shown in Table 1. This receiver performance was determined assuming enhancement due to cooling of the mixer diodes.

TABLE 1

| Parameter | Performance |
| --- | --- |
| RF to IF Conversion Gain | GT 20 dB |
| Noise Figure | LT 8 dB |
| Output I dB CP | NLT + 8 dBm |
| Output TOI | NLT + 18 dBm |
| Delta Channel Null Depth | LT 25 dB |

As also shown in FIG. 2, the receiver 50 has been partitioned into two main housings. In this embodiment, the RF housing 66 captures the RF energy, splits the captured RF signal into four channels and downconverts the RF signal to the C-Band frequency range. The C-Band frequency signals are fed to the low noise amplifiers (LNAs) 30 in the RF module which provide low noise amplification. The amplified C-band frequency signals are coupled from output ports 88 of the RF housing to input ports of the IF housing 92 via the connectors 90. The IF housing 92 includes phase and amplitude adjustment circuits similar to circuits 36 described above in conjunction with FIG. 1 which are used to appropriately adjust the amplitude and phase of the C-band frequency signals before the four signals are processed by a monopulse circuit which generates monopulse C-Band output signals of the receiver 50

The cryogenically cooled, low noise figure, millimeter wave, monopulse receiver 50 can be configured to adapt to a quasi-optical transmission line which forms the feed for a large diameter reflector antenna. Such a unit may also be used independent of the reflector to provide wider beam monopulse antenna performance for small projectiles or be placed in the focal plane of a lens assembly to provide appropriate feed illumination characteristics. In addition to missile radar applications, other configurations of the basic mixer architecture (cooled and uncooled) could be useful for various other commercial millimeter wave applications such as: weather radars, space based radiometers and satellite and airborne imaging systems.

Figure 3:
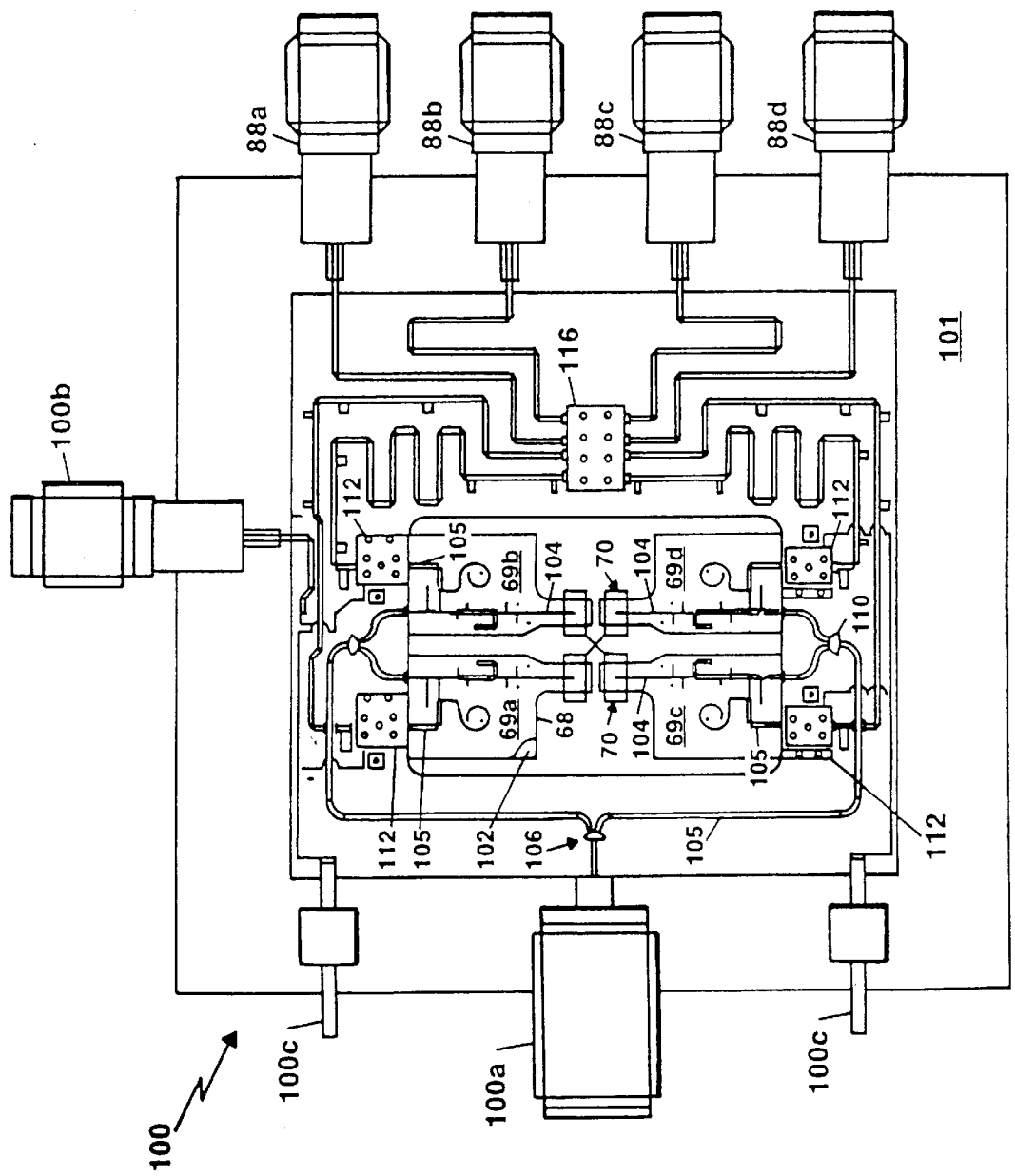
FIG. 3 is a plan view of a receiver.

Referring now to FIG. 3 an RF receiver assembly 100 is shown fabricated as a single module millimeter wave integrated circuit (MIC) having a local oscillator signal input port 100a, a calibration signal input port 100b, IF monopulse signal output ports 88a–88d and a pair of DC bias terminals 100c. The RF mixer circuit 69 is disposed on a substrate 68, here comprised of 0.005 inch thick alumina or other suitable microwave/millimeter wave substrate material, such as quartz, fused silca, gallium arsenide or any other suitable material know to those of ordinary skill in the art. The substrate 68 has disposed on a bottom surface thereof, a ground plane conductor 102. The substrate 68 has disposed over a top surface thereof a plurality of strip conductors 105 which form RF signal paths and an anti-parallel diode pair 104.

LO signals fed to LO input port 100a are coupled through a power divider 106 and fed to second and third power dividers 108, 110 which further divide the power and feed the LO signal to respective ports of mixer circuits 69a–69c. With the mixers properly biased, RF signals fed via the waveguides to the anti-parallel diode pairs 104 produce intermediate frequency signals at mixer IF output ports which are coupled to input ports of monolithic microwave integrated circuit (MMIC) low noise amplifiers (LNA's) 112. Each of the LNA's 112 provide the IF signals fed thereto to a corresponding one of a plurality of input ports of a MMIC monopulse network comparator 116. The MMIC monopulse comparator forms monopulse signals and provides the monopulse signals to IF output ports 88a–88d.

It should be noted that in this particular embodiment, the receiver 100 is disposed in a single housing 101 (in contrast to the multiple housing approach described above in conjunction with FIG. 2).

In operation, W-Band signals enter the RF assembly through waveguide transmission lines, such as a WR 10 waveguide transmission line, provided in the gold-plated stainless steel cover 60 (FIG. 2). An LO signal in the Q-band frequency range is fed through an RF connector such as a 2.4 millimeter (mm) coaxial connector at the input port 100a. The LO signal is coupled through a series of Wilkinson-type power splitters 106, 108, 110 and fed to each of the mixer circuits 69a–69d.

Each of the mixers 69a–69d provides an IF signal to an input of a gallium-arsenide (GaAs) MMIC LNA 112 which amplifies each of the IF output signals. The amplified IF output signals are coupled from the LNA 112 to respective input ports of a monopulse comparator circuit 116. The monopulse circuit 116 receives the IF signals fed thereto and generates monopulse output signals at IF output ports 88a–88d.

In one particular embodiment, the monopulse comparator circuit is fabricated using GaAs MMIC processing techniques and forms the sum and difference signals using MMIC lumped circuit elements.

The IF output signals and the calibration signal are coupled to the respective ports 88a–88d and 100b through OSMP glass bead coaxial connectors. Also coupled to housing 101 are a pair of reference voltage bias terminals 100b, 100c through which a DC bias signal is coupled to the two pairs of low noise amplifiers. In one particular embodiment, the bias source is provided as a +5 V DC bias source and the LNAs are selected to draw approximately 80 mA of current.

The waveguide-to-microstrip probe transition 70 feeds each W-Band signal into a diode pair of a subharmonic mixer. The diode pairs may be provided, for example, as back-to-back Schottky diodes responsive to signals in the frequency range of interest. The diodes mix the W-Band signal with the second harmonic of the Q-Band Local Oscillator input to generate an IF signal having a frequency in the C-Band frequency range.

Each of the Alumina mixer substrates 68 are provided having a thickness typically of about 0.005 inch (5 mils) to ensure proper mixer operation in the W-Band frequency range. The substrate, on which the LO distribution network and all IF circuitry is disposed, is provided as an Alumina substrate having a thickness of about 0.010 inch (i.e. 10 mils). The RF assembly 100 uses a combination of epoxies and solders to achieve good adhesion and ground contact between the substrates and the housing 101 for both room ambient and cryogenic temperature operation.

Figure 4:
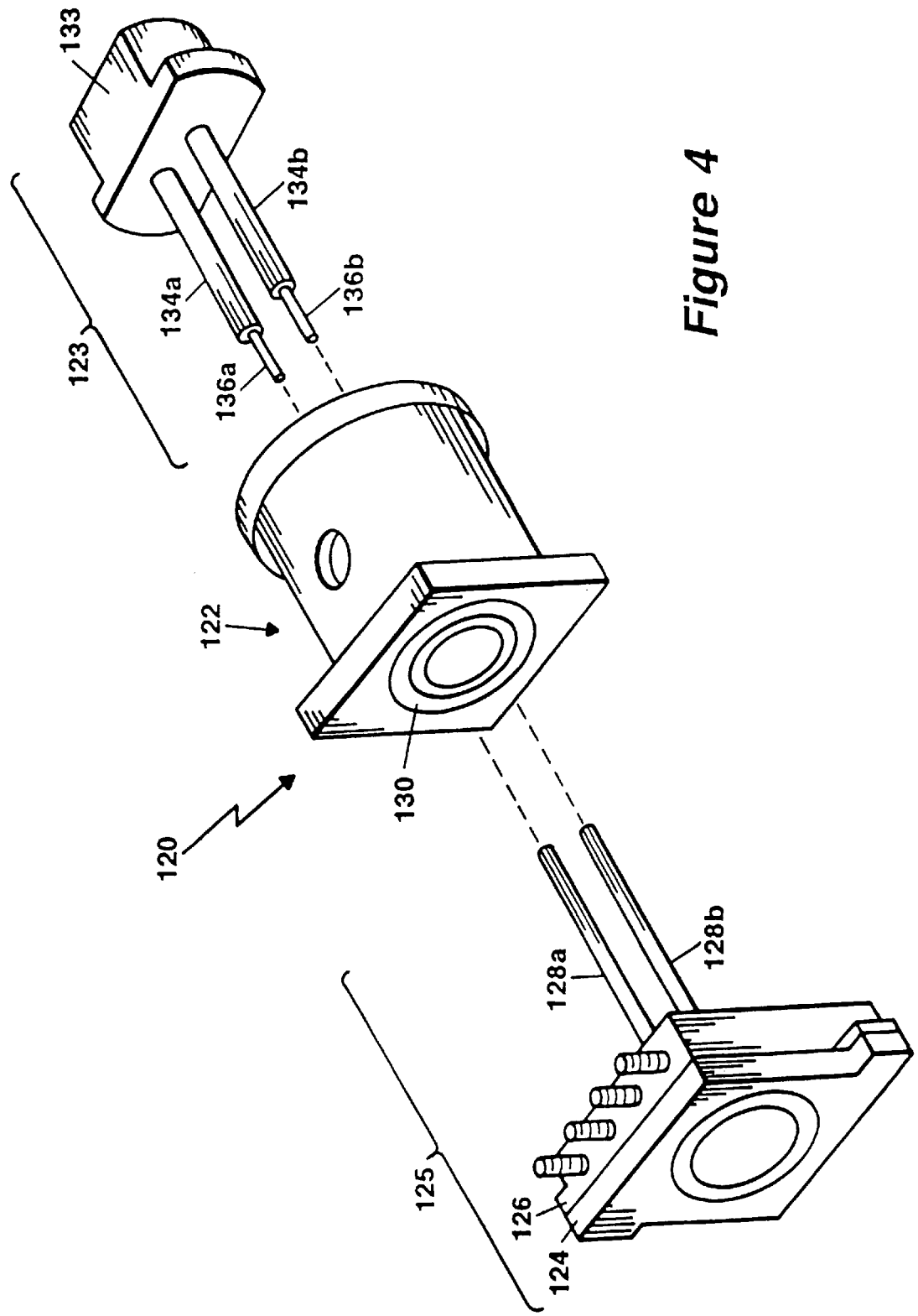
FIG. 4 is an exploded isometric view of a portion of a receiving system having a cooling system.

Referring now to FIG. 4, a partial exploded view of a receiver 120 reveals a Dewar 122 having a cryostat assembly 123 coupled to a first end there of and an RF module 125 coupled to a second end thereof. The cryostat assembly 123 includes a cryostat base plate 133 having cryostats 134a, 134b and cryostat exhaust portions 136a, 136b projecting therefrom. RF module 125 includes an RF module cover 124, an RF module base portion 126 and stainless steel tubes 128a, 128b. When the RF module 125 is coupled to Dewar 122, the module 125 is disposed over an O-ring groove 130 and tubes 128a, 128b accept portions of cryostat assembly 123. RF module 125 is provided from a material having a coefficient of thermal expansion which is relatively close to the coefficient of thermal expansion of the substrates disposed within the RF module base 126. For example, if the circuits disposed within the base 126 are provided as thin film Alumina microstrip circuits, the base 126 may be provided from a material such as Alloy 46 which has a coefficient of thermal expansion which is relatively close to the coefficient of thermal expansion of the thin film alumina microstrip substrates. Those of ordinary skill in the art will appreciate of course that other material combinations may also be used to provided the housing and the substrates disposed therein.

As mentioned above, in one embodiment, subharmonically pumped mixers use the second harmonic of the LO signal to efficiently downconvert the W-Band RF energy incident on the four channel receiver to the desired IF frequency where it can more easily be processed. GaAs Schottky anti-parallel beam lead diodes are the non-linear devices used in the mixer circuits 69a–69d. The diodes are mounted on five (5) mil thick alumina substrates where the filtering and transmission line structures for proper impedance matching to the diodes at the appropriate frequencies can be etched using thin film technology.

Figure 5:
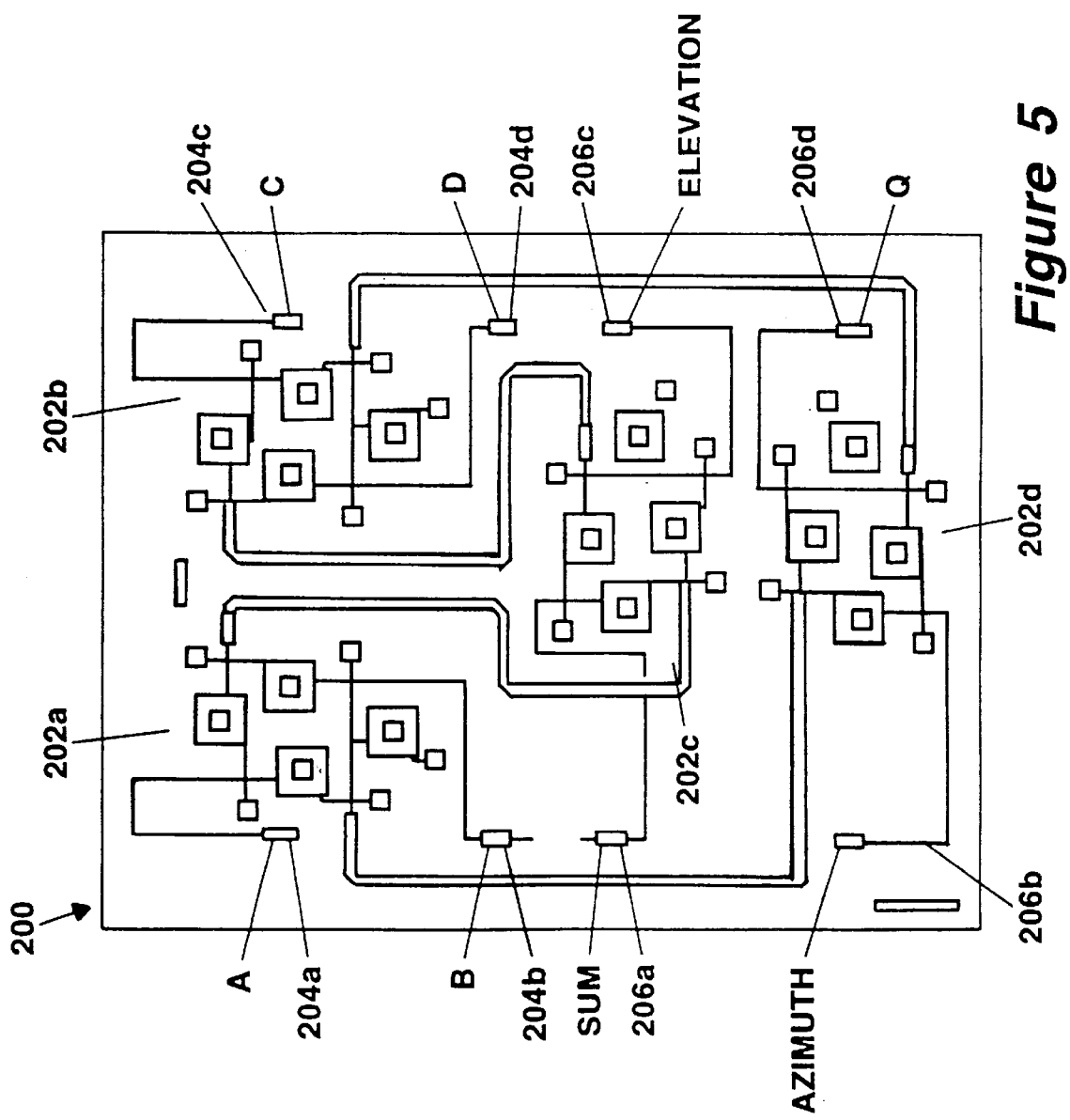
FIG. 5 is a schematic representation of a passive monopulse comparator in accordance with the present invention.

FIG. 5 shows an exemplary implementation of a passive MMIC monopulse comparator 200 in accordance with the present invention. In general, the monopulse 200 includes a series of lumped element hybrid circuits 202a–d coupled together so as to provide a completely passive device. Each of the lumped element hybrid circuits 202 includes so-called pi and T filter circuits that together provide the required signal phase shifts for the monopulse circuit, as described in detail below. This arrangement provides dramatic space and power savings over conventional monopulse circuits having distributed element hybrid circuits.

The monopulse comparator 200 receives on respective input ports 204a–d input signals A, B, C and D, which can correspond to the downconverted signals provided on input ports 40a–d from the amplitude and phase adjustment circuits 36 in FIG. 1. From the input signals A,B,C,D, the monopulse comparator 200 provides respective sum (SUM), azimuth ($\Delta$AZ), elevation ($\Delta$EL), and delta-delta or Q ($\Delta$Q) signals on output ports 206a–d for subsequent target tracking processing using techniques well known to one of ordinary skill in the art.

Figure 6:
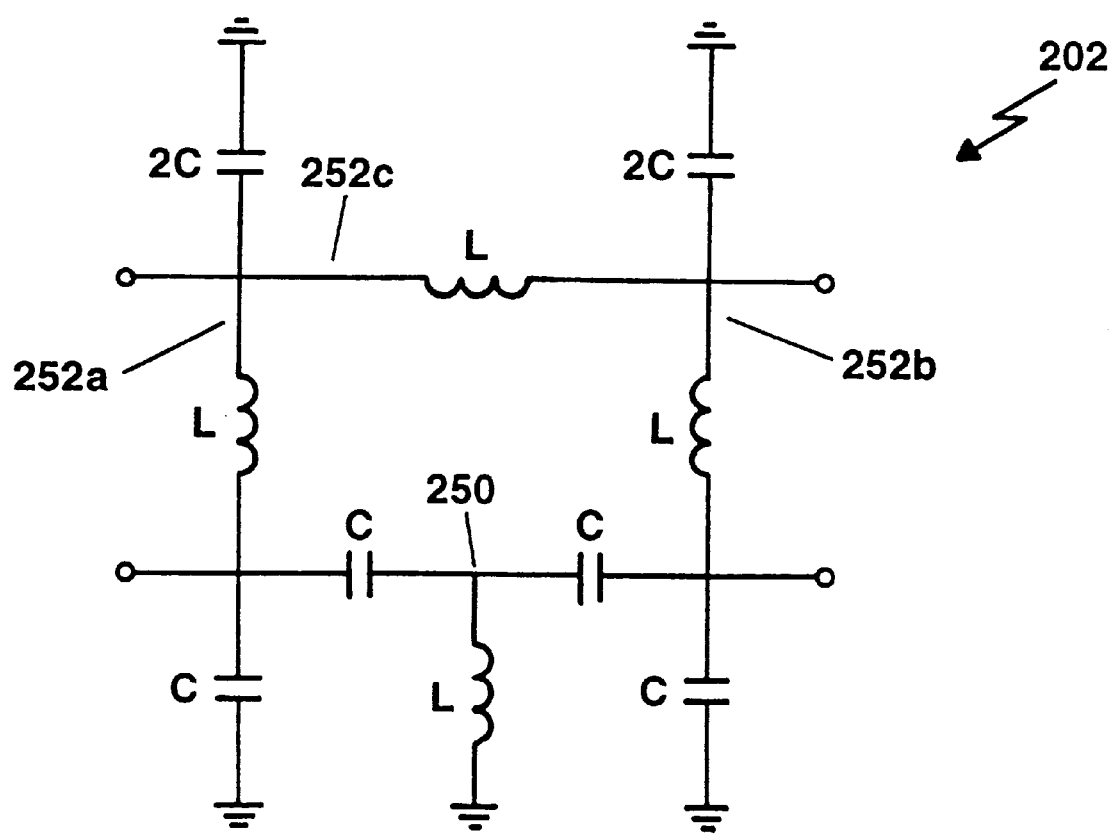
FIG. 6 is a schematic representation of a lumped element hybrid that forms a part of the passive monopulse comparator of FIG. 5.
Figure 7:
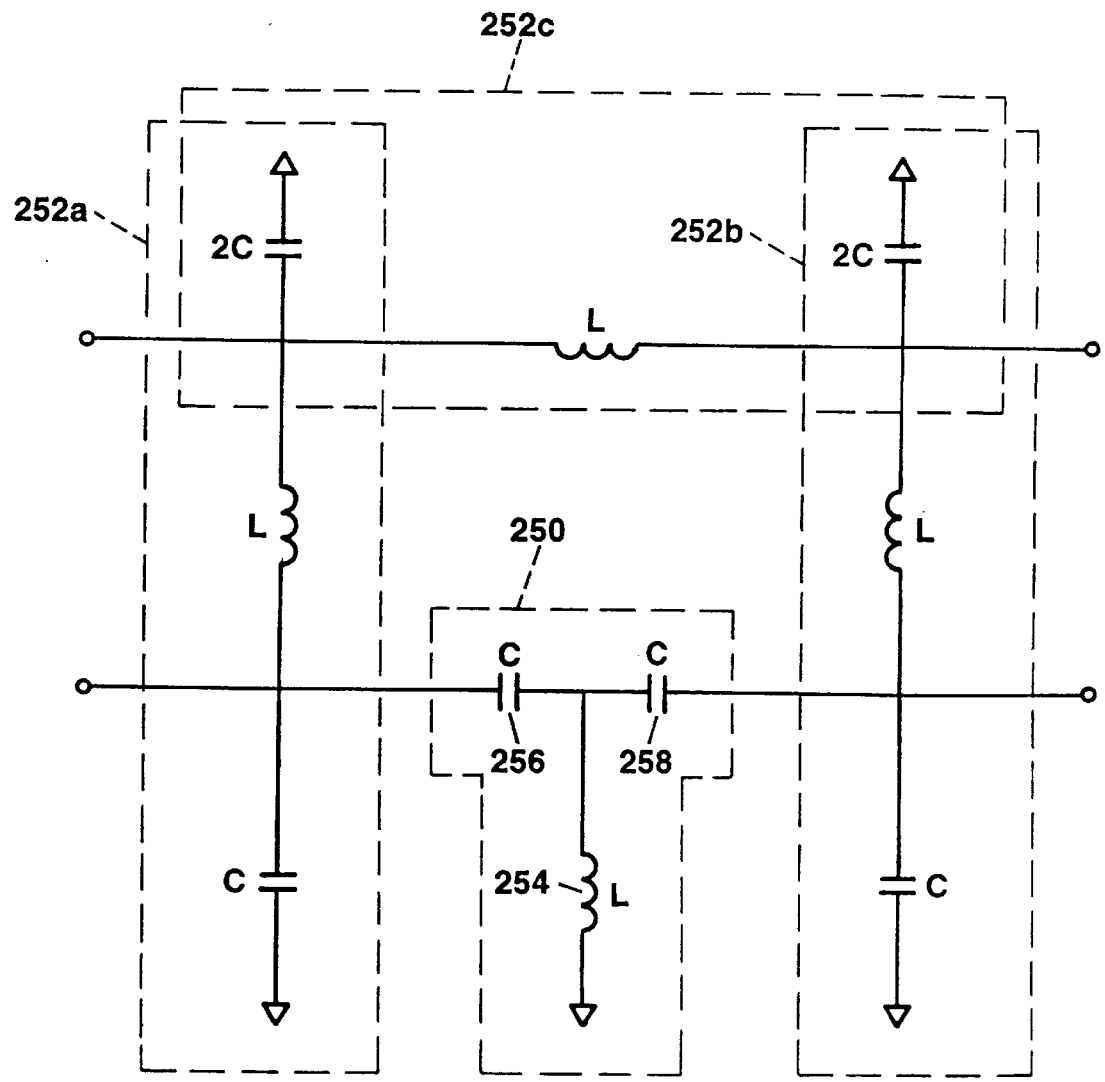
FIG. 7 is a schematic representation showing further details of the lumped element hybrid of FIG. 6.

FIGS. 6–7 schematically illustrate the lumped element hybrid circuits 202 of FIG. 5. In one embodiment, the hybrid circuit 202 includes one T circuit 250 and three pi circuits 252a–c. The T circuit 250 includes one inductor 254 coupled between first and second capacitors 256,258. That is, the T-circuit 250 has a series capacitor-shunt inductor-series capacitor arrangement. The T-circuit 250 can be considered a high pass filter that replaces three-quarter wavelength lines used in conventional 180 degree hybrid circuits.

The pi circuits 252a–c have a shunt capacitor-series inductor-shunt capacitor arrangement that provides a low pass filter circuit for replacing one-quarter wavelength lines in known hybrid circuits. The pi circuit provides a 90 degree phase shift and the T circuit provides a 270 degree phase shift for a relative phase shift of 180 degrees. The low and high pass filter structures of the hybrid circuit 200 replace components in conventional distributed element hybrid circuits, which rely upon transmission line lengths to provide the desired signal phase shifts. Thus, the filter structure of the passive device 200 achieves significant space savings over transmission line based circuits, particularly for embodiments in which the passive monopulse receives down-converted signals. In addition, the filter structure of the present invention is readily scalable for use at other frequencies, unlike transmission line based circuits.

In one embodiment, the relative impedance characteristic for each of the inductors is the same, i.e., L. The relative impedance values for the capacitors are shown as C and 2C. The capacitors furthest from the T circuit 250 can have a relative capacitance 2C twice the capacitance C of the other capacitors. This results from combining shunt capacitors from adjacent low pass filter (pi) circuits at the ports located opposite the T circuit 250.

It is understood that the impedance values for the inductors and capacitors can vary to achieve the requisite phase shifts from lumped element hybrid to lumped element hybrid. One of ordinary skill in the art can readily determine optimal impedance values for the inductive and capacitive elements of the lumped element hybrids.

In one embodiment, parasitic capacitances associated with the inductors were determined and taken into account in selecting the capacitance value C of the capacitors. For example, if an inductor has an associated parasitic capacitance of 1 pF and the desired capacitance value C for the capacitors is 3 pF, then circuit is implemented with a nominal capacitor value of 2 pF (3pF−1 pF). The parasitic capacitance value of the inductor provides, in combination with the nominal value provide the desired operational value of 3pF. Thus, the capacitive parasitics from the inductors are absorbed into adjacent capacitors. The inductor quality is improved in a sense to provide better monopulse performance.

Figure 8:
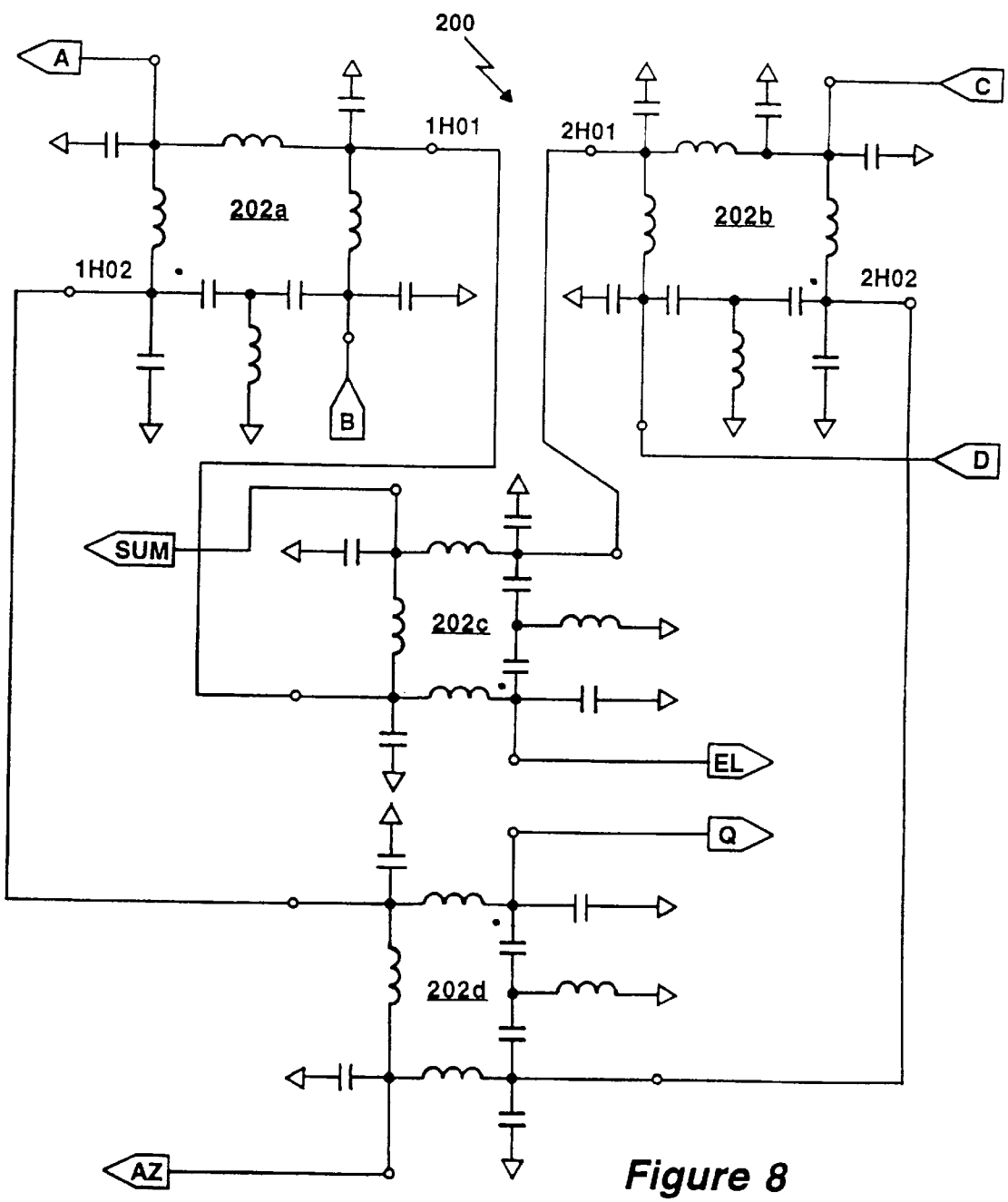
FIG. 8 is a circuit diagram of the monopulse comparator of FIG. 5.

FIG. 8 schematically shows the MMIC monopulse comparator 200 of FIG. 5, which includes four lumped element hybrid circuits 202a–d, such as those shown in FIGS. 6–7. The relative orientation of each lumped element hybrid 202 is indicated with a dot in a corner of the hybrid.

The first hybrid 202a receives input signals A and B and provides a first output signal 1HO1 to the third hybrid 202c and a second output signal 1HO2 to the fourth hybrid 202d. The second hybrid 202b receives input signals C and D and provides a first output signal 2HO1 to the third hybrid 202c and a second output signal 2HO2 to the fourth hybrid 202d. The third hybrid 202c, which receives signals 1HO1,2HO1 from the first and second hybrids 202a,b, provides the SUM channel signal and the elevation (EL) channel signal. The fourth hybrid 202d, which receives input signals 1HO2, 2HO2 from the first and second hybrids 202a,b, provides the azimuth (AZ) and delta-delta (Q) channel signals.

In one embodiment, the filter structures (pi and T) in the hybrids 202 have a characteristic impedance of about 70.7 Ohms to provide a well-matched reactive two-way power divider/combiner at each hybrid interface. In addition, the pi and T type structure duality reduces phase pushing and pulling of the filter response due to voltage standing wave ratio (VSWR) interactions. The duality of the pi and T filters also provides return losses with respect to each other that are similar in magnitude and phase response. Since the first and last element in each filter network are capacitors, the return losses are capacitive in phase. The filter duality also forces the insertion loss through each RF path to have similar values over a relatively broad frequency range. It is understood that the insertion loss is different for each network type due to phase lead or lag associated with the orientation of the hybrid. That is, a series inductor provides a phase lag while a shunted inductor provides a phase lead.

Connections within the hybrids 202 and connections external to the monopulse can be formed from high impedance (narrow) lines, e.g., 100 Ohms, to reduce junction effects that can distort the signals. Transmission line lengths interconnecting the hybrids can have low impedance (wide) lines corresponding to about 90 degrees, i.e., quarter phase, to reduce VSWR interactions between the hyrbids. Otherwise, reflected signals can cancel each other due to the 180 degree round trip phase shift. The relative wideness and narrowness of the internal and external hybrid connection is apparent from FIG. 5.

In one embodiment, air bridges used in prior art devices were replaced with wire-bonding from adjacent circuitry in the next higher level of assembly to the chip I/O pads over transmission lines. This arrangement improves channel-to-channel isolation on the passive monopulse chip to prevent a leakage signal on the order of 25 to 30 dB from "swamping out" the low amplitude delta nulls.

A C-band monopulse comparator circuit like that shown in FIG. 5 was fabricated and tested. The SUM channel insertion loss and delta channel null depth for each of the three delta outputs (AZ,EL,Q) were measured vs. frequency for the case where the target was "on boresight." As known to one of ordinary skill in the art, ideal monopulse patterns would display 0 dB sum channel insertion loss and an infinite null depth for each of the AZ, EL, and Q channel outputs. Results at the center frequency of operation are provided in Table 1 below.

TABLE 1

| Parameter | Result (dB) |
| --- | --- |
| Sum Channel Insertion Loss | 2.9 |
| Azimuth Channel Null Depth | 27.2 |
| Elevation Channel Null Depth | 26.9 |
| Q Channel Null Depth | 33.2 |

It should be noted that approximately 1.5 dB of test fixture insertion loss is included in the data presented in Table 1, so that actual sum channel insertion loss is on the order of 1.4 dB.

Figure 9:
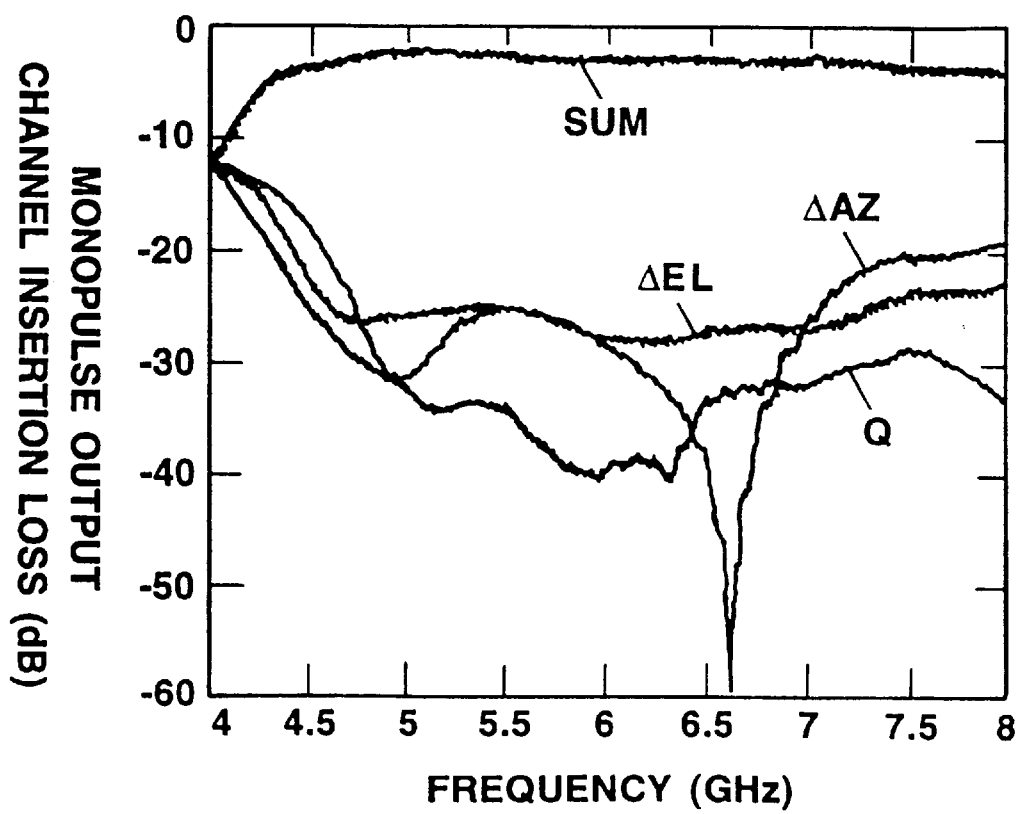
FIG. 9 is a graphical depiction of signal insertion loss versus frequency for a device fabricated in accordance with the present invention.

FIG. 9 graphically illustrates the SUM, AZ, EL, and Q insertion loss versus frequency of the C-band device described above. As can be seen from the insertion loss data, a relatively broad fractional bandwidth of approximately 37.5 ((7−4.75)/6)(100) percent is achieved. As know to one of ordinary skill in the art, fractional bandwidth is defined as $(f_H-f_L)/f_C$, where $f_H$ and $f_L$ are the highest and lowest frequency respectively allowing a predetermined null depth threshold, e.g., 25 dB, for the delta channels about a center frequency $f_C$.

Passive MMIC monopulse comparators in accordance with the present invention provide significant advantages over prior art monopulse comparators. For example, the passive monopulse comparator of the present invention eliminates DC power consumption and thermal dissipation. Due to its passive nature, the passive monopulse behaves well over a relatively wide temperature range unlike active devices. This feature of the invention can provide an important advantage over conventional active monopulse circuits, particularly in cryogenically cooled systems.

Since similar values are used for the inductors in each orientation (shunt or series), the hybrid of the present invention is inherently insensitive to processing variations. More particularly, if a series inductor value in the low pass filter structure (pi) is different than desired due to processing tolerances, than the shunt inductor value will vary in a similar manner. These variations are removed in the delta output where the difference operation is performed, which causes good delta channel null depths to be attained that are unaffected by processing variations. Thus, the passive monopulse of the present invention does not require tuning and is readily scalable for operation at a desired frequency.

Unlike standard distributed rat race hybrids, the geometric shape of the passive monopulse is symmetric such that one input or output is located on each of four sides. This arrangement forces each signal to propagate through the same number of mitered corners on each hybrid, so that any parasitic loss or phase shift incurred by a signal passing through a corner is similarly incurred by the other monopulse signals.

The passive monopulse of the present invention also provides considerable space savings over known transmission line-based monopulse hybrids. For example, a C-band passive monopulse in accordance with the present invention occupies a total volume of about 0.00012 cubic inches (0.161"×0.190"×0.004"). A frequency scaled L-band version measures about 0.00018 cubic inches (0.187"×0.239×

0.004"). An increase in wavelength of about 300 percent requires a concomitant chip size increase of about 50 percent. A conventional C-band monopulse can be about 13,500 times larger than a passive C-band monopulse in accordance with the present invention.

Accordingly, having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims. All references cited herein are incorporated herein by reference in their entirety.

What is claimed is:

1. A passive MMIC monopulse comparator circuit comprising:
    a first lumped element hybrid circuit; and
    a second lumped element hybrid circuit coupled to the first lumped element hybrid circuit, wherein the first lumped element hybrid circuit and the second lumped element hybrid circuit form a part of the passive MMIC monopulse comparator circuit.

2. The circuit according to claim 1, wherein each of the first and the second humped element hybrid circuits includes a T circuit coupled to a pi circuit.

3. The circuit according to claim 2 wherein the T circuit is a series capacitor, shunt inductor, and series capacitor type T circuit.

4. The circuit according to claim 2, wherein the pi circuit is a shunt capacitor, series inductor, shunt capacitor type pi circuit.

5. The circuit according to claim 1, wherein at least one of the first and the second lumped element hybrid circuits includes a first series circuit path including a first capacitor, a first inductor and a second capacitor, a second series circuit path including a third capacitor, a second inductor and a fourth capacitor, a third series circuit path including fifth and sixth capacitors, a fourth series circuit path including the first and second inductors, a third inductor and the fifth and sixth capacitors, and a fourth inductor coupled between the fifth and sixth capacitors.

6. The circuit according to claim 5, wherein the first and third capacitors have a capacitance value that is about double a capacitance value of the second, four, fifth and sixth capacitors.

7. A passive MMIC monopulse comparator, comprising:
    a first lumped element hybrid circuit receiving first and second input signals and providing first and second output signals;
    a second lumped element hybrid circuit receiving third and fourth input signals and providing third and fourth output signals;
    a third lumped element hybrid circuit receiving the first output signal from the first lumped element hybrid circuit and the third output signal from the second lumped element hybrid circuit and providing a sum channel output signal and an elevation channel output signal; and
    a fourth lumped element hybrid circuit receiving the second output signal from the first lumped element hybrid circuit and the fourth output signal from the second lumped element hybrid circuit and providing an azimuth channel output signal and a Q channel output signal.

8. The monopulse comparator according to claim 7, wherein the first lumped element hybrid circuit includes a plurality of pi-type circuits and a T type circuit.

9. The monopulse comparator according to claim 7, wherein the first lumped element hybrid circuit includes a first series circuit path including a first capacitor, a first inductor and a second capacitor, a second series circuit path including a third capacitor, a second inductor and a fourth capacitor, a third series circuit path including fifth and sixth capacitors, a fourth series circuit path including the first and second inductors, a third inductor and the fifth and sixth capacitors, and a fourth inductor coupled between the fifth and sixth capacitors.

10. The monopulse comparator circuit according to claim 9, wherein the fifth and sixth capacitors and the fourth inductor comprise a T type circuit.

11. The monopulse comparator circuit according to claim 9, wherein the first capacitor, the first inductor, and the second capacitor comprise a pi type circuit.

12. A radar system, comprising:
    an antenna having a plurality of antenna ports, the antenna responsive to signals having a frequency in a predetermined frequency range;
    a plurality of protection circuits each of the protection circuits having a first port coupled directly to a respective one of the plurality of antenna ports and a second port, each protection circuit responsive to a first control signal which allows signals to propagate in a first direction between the first port of the protection circuit and the second port of the protection circuit and each protection circuit also responsive to a second control signal which allows signals to propagate in a second opposite direction between the first port of the protection circuit and the second port of the protection circuit;
    a receiver circuit for downconverting signals from the second ports of the protection circuits to IF signals, the receiving circuit including a passive MMIC monopulse comparator.

13. The system according to claim 12, wherein the receiving circuit further includes:
    a plurality of mixers, each of the plurality of mixers having a first port coupled to a respective one of the plurality of protection circuits, a second port for receiving a bias signal, and a third port for providing a frequency shifted signal; and
    a plurality of amplifiers, each of the plurality of amplifiers having a first port coupled to the third port of a respective one of the plurality of mixers and a second port coupled to the monopulse comparator.

* * * * *

UNITED STATES PATENT AND TRADEMARK OFFICE
CERTIFICATE OF CORRECTION

PATENT NO. : 6,498,582 B1  Page 1 of 1
DATED : December 24, 2002
INVENTOR(S) : Anthony Sweeney et al.

It is certified that error appears in the above-identified patent and that said Letters Patent is hereby corrected as shown below:

Column 2,
Line 47, delete "wavelength," and replace with -- wavelength --.

Column 8,
Line 8, delete "to mixer" and replace with -- to the mixer --.
Line 33, delete "appropriately" and replace with -- appropriate --.

Column 9,
Line 43, delete "(non-uniform module heating)." and replace with -- non-uniform module heating. --.
Line 66, delete "A optional" and replace with -- An optional --.

Column 10,
Line 9, delete "40," and replace with -- 40 --.
Line 12, delete "temperatures" and replace with -- temperature --.

Column 12,
Line 49, delete "at particular" and replace with -- at a particular --.

Column 15,
Line 40, delete "there of" and replace with -- thereof --.

Column 17,
Line 53, delete "hyrbids." and replace with -- hybrids. --.

Column 19,
Line 24, delete "humped" and replace with -- lumped --.
Line 44, delete "four," and replace with -- fourth, --.

Signed and Sealed this

Seventeenth Day of June, 2003

JAMES E. ROGAN
*Director of the United States Patent and Trademark Office*